United States Patent
Kazama et al.

(10) Patent No.: US 7,748,989 B2
(45) Date of Patent: Jul. 6, 2010

(54) CONDUCTIVE-CONTACT HOLDER AND CONDUCTIVE-CONTACT UNIT

(75) Inventors: Toshio Kazama, Nagano (JP); Hiroshi Nakayama, Nagano (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

(21) Appl. No.: 12/292,670

(22) Filed: Nov. 24, 2008

(65) Prior Publication Data
US 2009/0093161 A1      Apr. 9, 2009

Related U.S. Application Data

(62) Division of application No. 10/578,312, filed as application No. PCT/JP2004/016342 on Nov. 4, 2004, now Pat. No. 7,470,149.

(30) Foreign Application Priority Data
Nov. 5, 2003   (JP) ............... 2003-376022
Jun. 15, 2004  (JP) ............... 2004-177471

(51) Int. Cl.
*H01R 13/648* (2006.01)
(52) U.S. Cl. ............ 439/66; 439/700; 439/607.05
(58) Field of Classification Search ............ 439/66, 439/700, 607.05
See application file for complete search history.

(56) References Cited

U.S. PATENT DOCUMENTS 5,906,511 A * 5/1999 Bozzer et al. ............ 439/579
6,027,345 A * 2/2000 McHugh et al. ............ 439/66
6,533,613 B1 * 3/2003 Turner et al. ............ 439/607.05
6,877,223 B2 * 4/2005 Figueroa et al. ............ 29/884
2002/0196614 A1 * 12/2002 DiBene et al. ............ 361/803

FOREIGN PATENT DOCUMENTS

| EP | 1 422 530 A2 | 5/2004 |
| EP | 1 471 357 A2 | 10/2004 |
| EP | 1 482 313 A1 | 12/2004 |
| JP | 50-2060 | 1/1975 |
| JP | 60-207343 | 10/1985 |
| JP | 11-242065 | 9/1999 |
| JP | 2001-091538 | 4/2001 |
| JP | 2001-099889 | 4/2001 |
| JP | 2002-124552 | 4/2002 |
| WO | WO-03/067268 A1 | 8/2003 |

OTHER PUBLICATIONS

International Search Report, Feb. 22, 2005, PCT/JP2004/016342.
European Search Report dated Nov. 30, 2009 issued in European Patent Application No. 04 81 8184.

* cited by examiner

*Primary Examiner*—Gary F. Paumen
(74) *Attorney, Agent, or Firm*—Edwards Angell Palmer & Dodge LLP

(57) ABSTRACT

A conductive-contact holder base accommodates at least a signal conductive-contact that is a conductive contact for performing input and output of a signal for a predetermined circuit configuration and a ground conductive-contact that is a conductive contact for supplying a ground potential to the predetermined circuit configuration. A holder base is formed of a conductive material, including a first opening for accommodating the signal conductive-contact; and a second opening for accommodating the ground conductive-contact while maintaining an electrical connection with the ground conductive-contact. An insulating member covers an inner surface of the first opening.

5 Claims, 14 Drawing Sheets

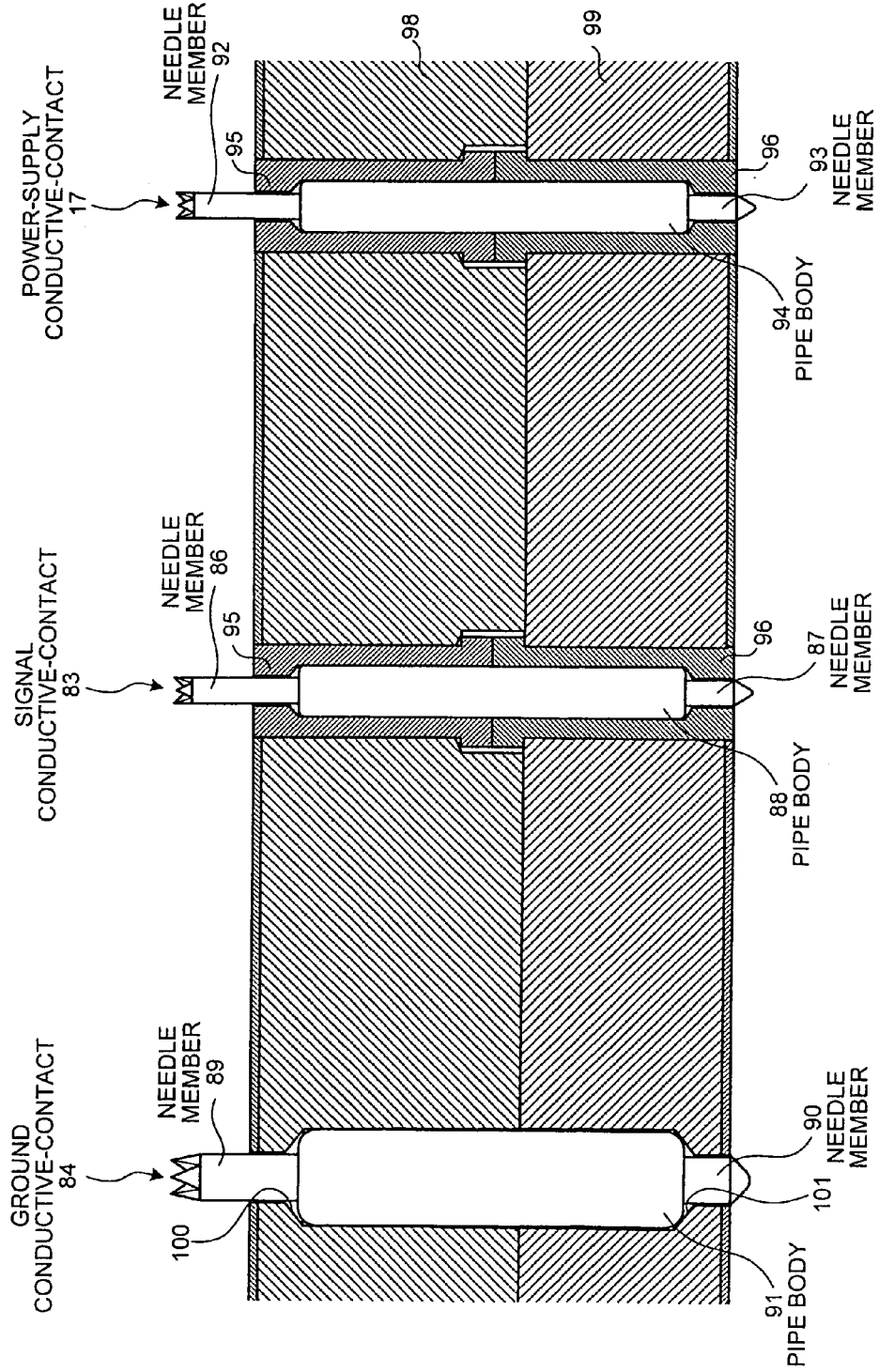

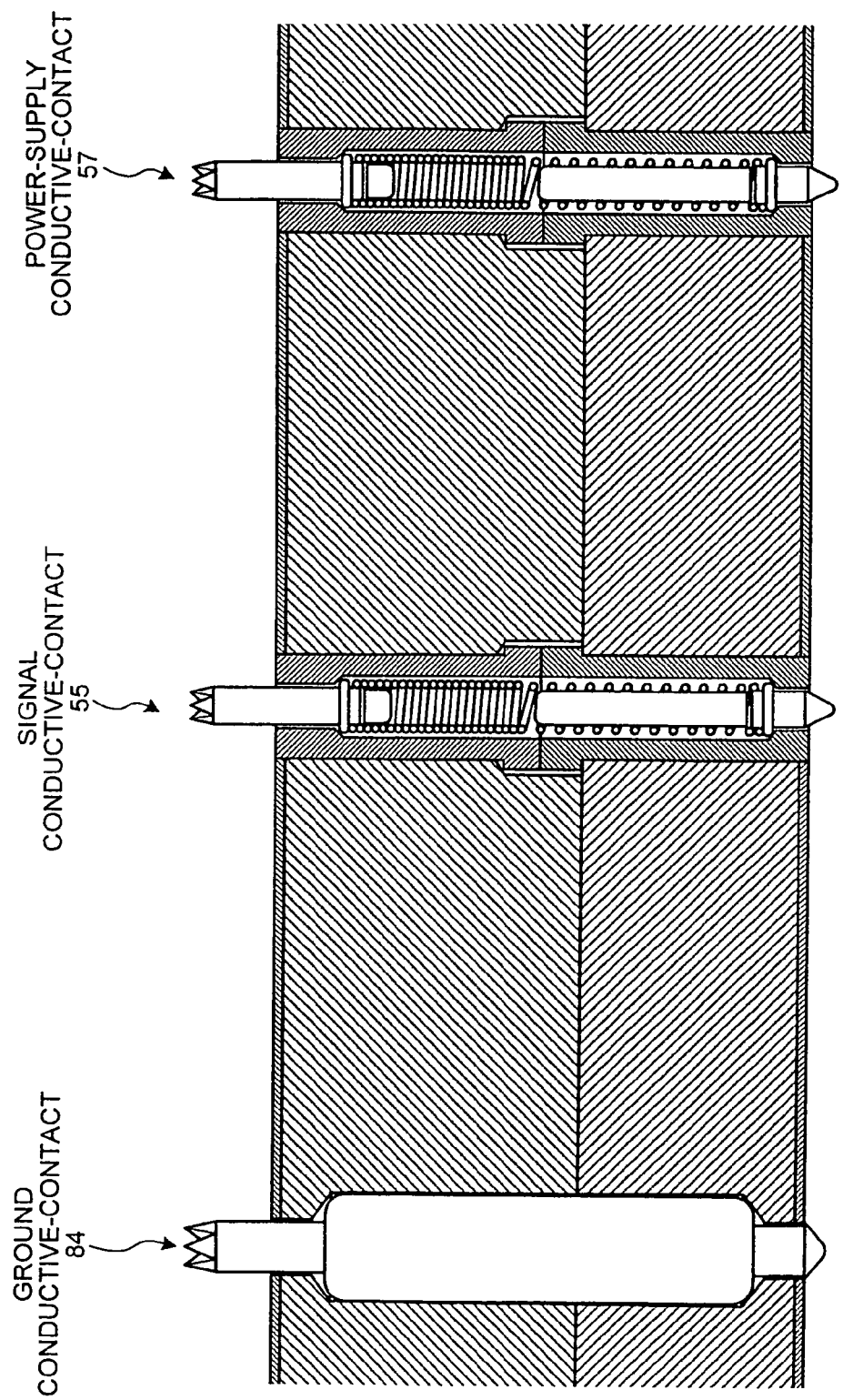

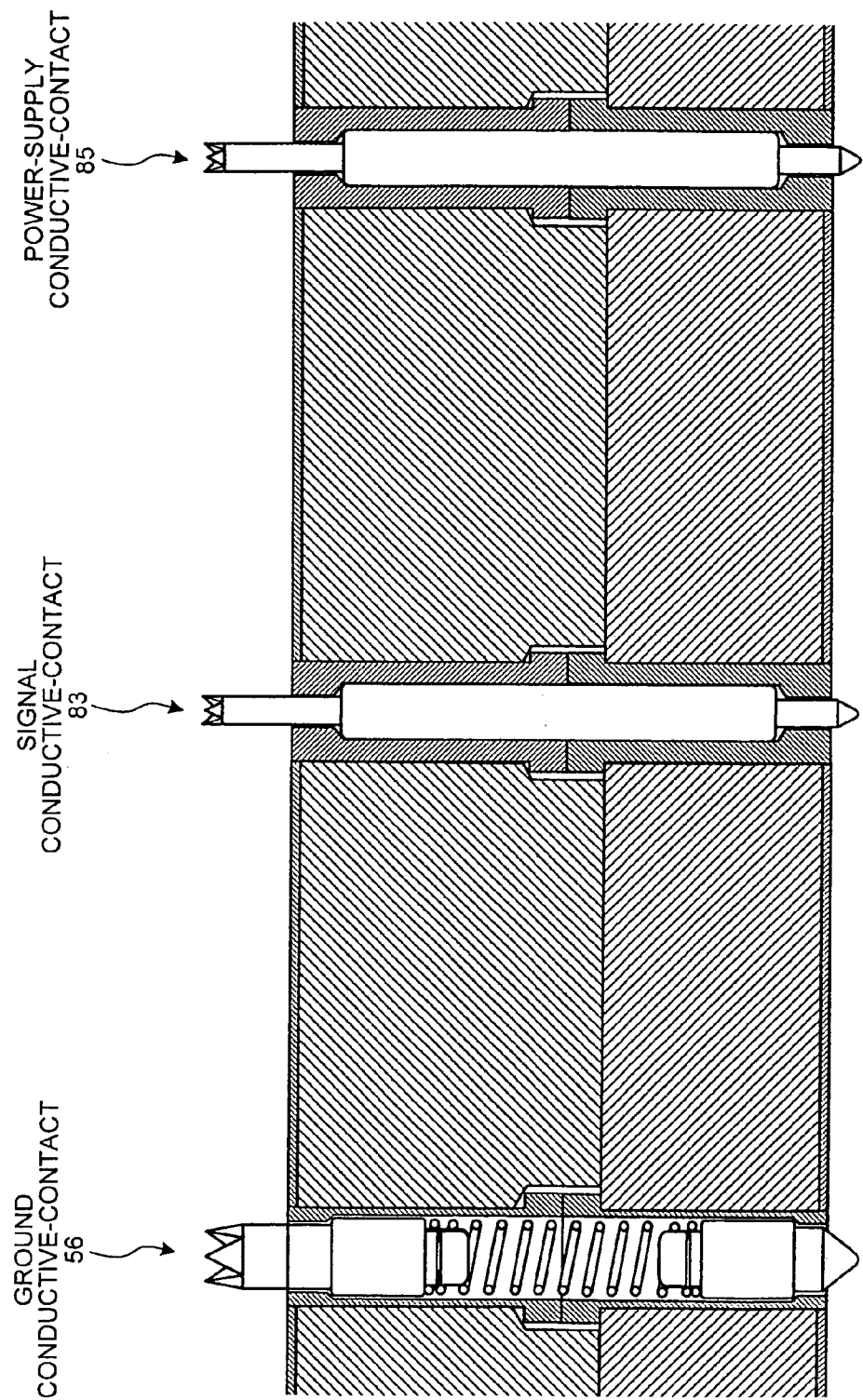

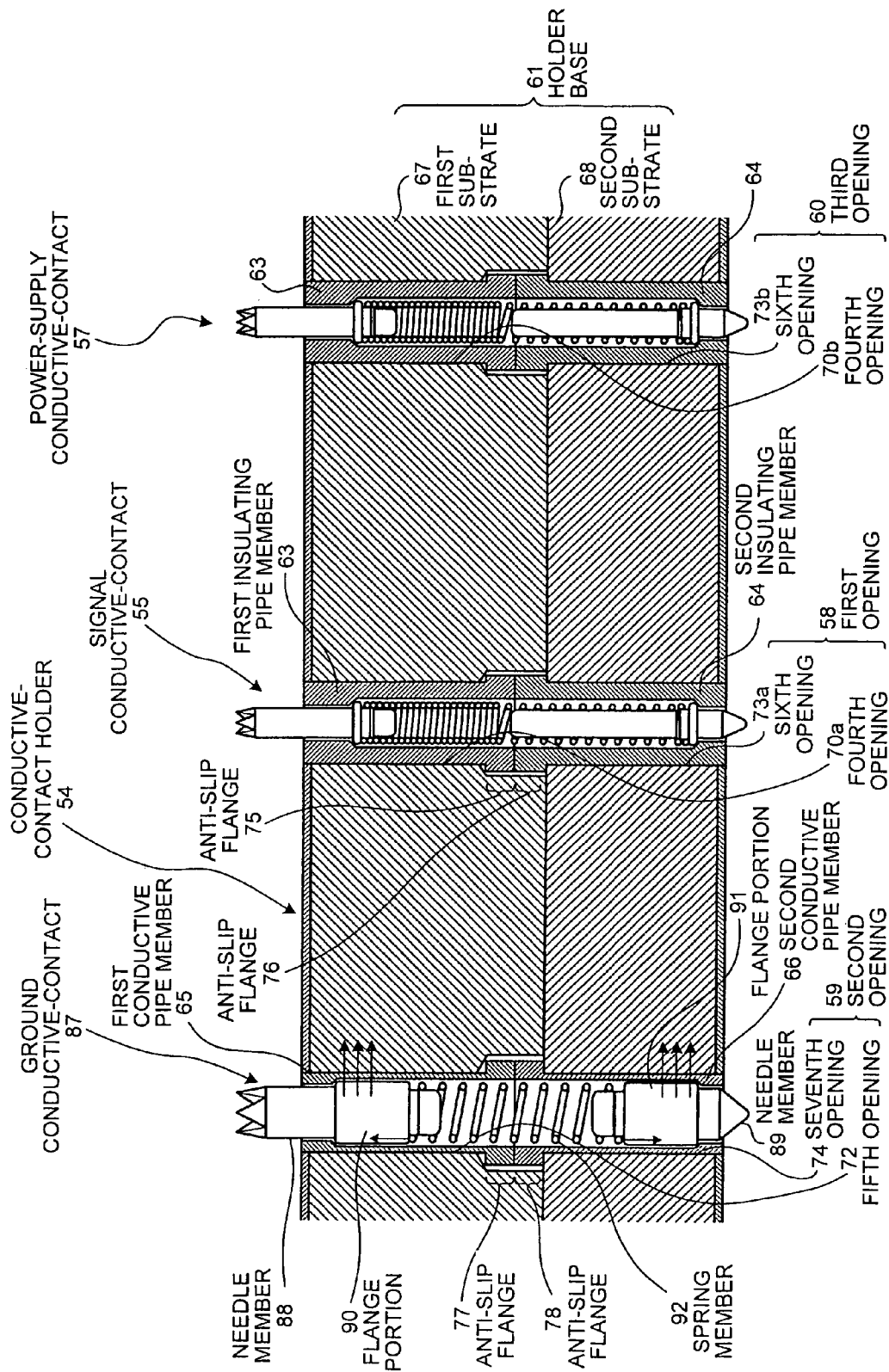

CONDUCTIVE-CONTACT HOLDER AND CONDUCTIVE-CONTACT UNIT

BACKGROUND OF THE INVENTION

1. Field of the Invention

The present invention relates to a conductive-contact holder that accommodates at least a conductive contact for signal used to input and output a signal to and from a predetermined circuit configuration and a conductive contact for grounding used to supply ground potential to the predetermined circuit configuration, and also relates to a conductive-contact unit.

2. Description of the Related Art

In the technological field of testing electric characteristics of semiconductor integrated circuits, a technology for the following conductive-contact unit has been known. The conductive-contact unit includes a plurality of conductive contacts that are arranged corresponding to connection electrodes for external devices in the semiconductor integrated circuit. The conductive-contact unit includes the conductive contacts, a conductive-contact holder with openings formed therein to accommodate the conductive contacts, and test circuits electrically connected to the conductive contacts (see Patent Literature 1).

The conductive contacts included in the conductive-contact unit are classified into three types of conductive contacts. One of the three types is a conductive contact for signal that inputs and outputs a predetermined signal to and from a semiconductor integrated circuit that is a target to be tested. The other ones are a conductive contact for grounding that supplies ground potential to the semiconductor integrated circuit, and a power-supply conductive-contact that supplies drive power to the semiconductor integrated circuit. These conductive contacts are electrically connected to signal generating circuits included in the test circuits, respectively, to accomplish the functions.

[Patent Literature 1] Japanese Patent Application Laid Open Publication No. 2002-124552.

DISCLOSURE OF INVENTION

Problem to be Solved by the Invention

Recently, however, the semiconductor integrated circuits have been miniaturized and the operation thereof has been speeded up. This tendency requires that the conductive-contact unit employs a structure allowing it to be miniaturized and to perform a high-speed operation, but conventional conductive-contact units cannot address these requirements sufficiently.

For example, with the miniaturization of the semiconductor integrated circuit, a plurality of connection electrodes for external devices included in a semiconductor integrated circuit are miniaturized. As a result of the miniaturization thereof, the outer diameter of the conductive contact is downsized to about 1 millimeter or less to cause reduction in contact area between the conductive contact and an electrode of a circuit board disposed below the conductive-contact holder. Therefore, it becomes difficult to supply stable ground potential to the conductive contact for grounding that supplies ground potential to the semiconductor integrated circuit.

More specifically, in order to supply stable ground potential to the semiconductor integrated circuit, it is required to have such a condition that the conductive contact for grounding has stable ground potential. However, if the conductive contact for grounding has a small contact area with an electrode extended from the circuit configuration that supplies ground potential to the conductive contact for grounding, the conductive contact for grounding is difficult to be supplied with sufficient ground potential.

Moreover, the precision of impedance matching between the semiconductor integrated circuit and the conductive contact for signal also becomes a problem when the operation of the semiconductor integrated circuit is speeded up. In other words, when a high-frequency electrical signal is input or output, it is generally known that input efficiency of the electrical signal is reduced according to a difference between intrinsic impedances. Therefore, in order to stably perform testing or the like, it is necessary to use the conductive contact for signal in which the intrinsic impedances are matched with precision. However, the outer diameter of the conductive contact for signal is downsized to about 1 millimeter or less with miniaturization of the semiconductor integrated circuit, which makes it difficult to adjust the intrinsic impedance of the micro-conductive contact for signal itself.

The present invention has been devised in view of the above problems and it is an object of the present invention to provide a conductive-contact holder and a conductive-contact unit that support a compactness of a circuit structure and a high-speed operation of a semiconductor integrated circuit that is made into contact upon being used.

To solve the above problems and to achieve the object, a conductive-contact holder accommodates at least a signal conductive-contact that is a conductive contact for performing input and output of a signal for a predetermined circuit configuration and a ground conductive-contact that is a conductive contact for supplying a ground potential to the predetermined circuit configuration. The conductive-contact holder includes a holder base that is formed of a conductive material, including a first opening for accommodating the signal conductive-contact, and a second opening for accommodating the ground conductive-contact while maintaining an electrical connection with the ground conductive-contact; and an insulating member that covers an inner surface of the first opening.

According to the invention, because the ground conductive-contact and the holder base are electrically connected, a stable ground potential can be supplied to the predetermined circuit configuration The conductive-contact holder may further include a conductive pipe member disposed in the first opening so that an inner surface of the conductive pipe member is in contact with the ground conductive-contact.

A conductive-contact holder accommodates at least a signal conductive-contact that is a conductive contact for performing input and output of a signal for a predetermined circuit configuration. The conductive-contact holder includes a holder base that includes an opening for accommodating the signal conductive-contact; and an impedance correcting member that is formed of an dielectric material and is formed to be positioned along an outer periphery of the signal conductive-contact while the signal conductive-contact is accommodated in the opening, and that corrects an intrinsic impedance of the signal conductive-contact.

According to the invention, because the impedance correcting member that corrects the intrinsic impedance of the signal conductive-contact is provided, a value of the intrinsic impedance can be corrected without changing a structure of the signal conductive-contact.

In the conductive-contact holder according to the invention, the signal conductive-contact is in a cylindrical shape with a predetermined outer diameter, and the impedance correcting member is in a tubular shape and coaxial with the signal conductive-contact, and corrects the intrinsic impedance by adjusting an outer diameter of the tubular shape and the dielectric constant of the dielectric material.

In the conductive-contact holder according to the invention, the holder base is electrically conductive.

In the conductive-contact holder according to the invention, the holder base is formed of a material conforming to a thermal expansion coefficient of the predetermined circuit configuration.

In the conductive-contact holder according to the invention, the holder base further includes a third opening for accommodating a power-supply conductive-contact that supplies a power to the predetermined circuit configuration; and an insulating member that covers an inner surface of the third opening.

In the conductive-contact holder according to the invention, the holder base further includes a first substrate that is formed of a conductive material, including a fourth opening corresponding to the first opening, and a fifth opening corresponding to the second opening; and a second substrate that is formed of a conductive material, including a sixth opening corresponding to the first opening, and a seventh opening corresponding to the second opening. The second substrate is fixed to the first substrate so that the sixth opening communicates with the fourth opening and the seventh opening communicates with the fifth opening. The insulating member includes a first insulating pipe member inserted into the fourth opening; and a second insulating pipe member inserted into the sixth opening.

In the conductive-contact holder according to the invention, the first insulating pipe member includes an anti-slip flange formed in one end thereof, the second insulating pipe member includes an anti-slip flange formed in one end thereof, and the first insulating pipe member is inserted into the fourth opening and the second insulating pipe member is inserted into the sixth opening so that the anti-slip flanges are positioned on the side of a boundary between the first substrate and the second substrate.

The conductive-contact holder according to the invention may further include a first conductive pipe member that includes an anti-slip flange formed in one end thereof, and is inserted into the fifth opening so that the anti-slip flange is positioned on the side of a boundary between the first substrate and the second substrate; and a second conductive pipe member that includes an anti-slip flange formed in one end thereof, and is inserted into the seventh opening so that the anti-slip flange is positioned on the side of the boundary between the first substrate and the second substrate.

In the conductive-contact holder according to the invention, the first conductive pipe member has an outer shape different from that of the first insulating pipe member, and the second conductive pipe member has an outer shape different from that of the second insulating pipe member.

In the conductive-contact holder according to the invention, the first conductive pipe member has an outer diameter larger than that of the first insulating pipe member, and the second conductive pipe member has an outer diameter larger than that of the second insulating pipe member.

In the conductive-contact holder according to the invention, the anti-slip flange of the first conductive pipe member has an outer diameter larger than that of the anti-slip flange of the first insulating pipe member, and the anti-slip flange of the second conductive pipe member has an outer diameter larger than that of the anti-slip flange of the second insulating pipe member.

In the conductive-contact holder according to the invention, the anti-slip flange of the first conductive pipe member has a length in an insertion direction of the first conductive pipe member longer than that in an insertion direction of the first insulating pipe member, and the anti-slip flange of the second conductive pipe member has a length in an insertion direction of the second conductive pipe member longer than that in an insertion direction of the second insulating pipe member.

A conductive-contact unit according to the invention includes a signal conductive-contact for performing input and output of a signal for a predetermined circuit configuration; a ground conductive-contact for supplying a ground potential to the predetermined circuit configuration; a conductive-contact holder including a holder base that is formed of a conductive material that includes a first opening for accommodating the signal conductive-contact and a second opening for accommodating the ground conductive-contact while maintaining an electrical connection with the ground conductive-contact, and an insulating member that covers an inner surface of the first opening; and a circuit board including a circuit that is electrically connected to at least the signal conductive-contact and generates a signal to be input to the predetermined circuit configuration.

In the conductive-contact unit according to the invention, the signal conductive-contact is in a cylindrical shape with a predetermined outer diameter, and the insulating member is in a tubular shape and coaxial with the signal conductive-contact, and corrects an intrinsic impedance of the signal conductive-contact by adjusting an outer diameter of the tubular shape and the dielectric constant of the dielectric material.

The conductive-contact unit according to the invention may further include a ground-potential supply unit that supplies a ground potential; and a connecting unit that electrically connects the holder base and the ground-potential supply unit.

SUMMARY OF THE INVENTION

In the conductive-contact holder and the conductive-contact unit according to one aspect of the present invention, the conductive contact for grounding is electrically connected to the holder base. Therefore, stable ground potential can be supplied to the predetermined circuit configuration. Even if the conductive-contact holder and the conductive-contact unit are miniaturized, it is possible to supply stable ground potential to the predetermined circuit configuration.

The conductive-contact holder and the conductive-contact unit according to another aspect of the present invention include the impedance correcting member that corrects intrinsic impedance in the conductive contact for signal. Therefore, the value of the intrinsic impedance can be corrected without changing the structure of the conductive contact for signal. Thus, it is possible to realize the conductive-contact unit capable of inputting and outputting electrical signals with high efficiency to and from the predetermined circuit configuration that is compact and operates at high speed.

BRIEF DESCRIPTION OF DRAWINGS

FIG. 11 is a schematic diagram of another modification of the conductive-contact unit according to the third embodiment;

FIG. 12 is a schematic diagram of still another modification of the conductive-contact unit according to the third embodiment;

FIG. 13 is a schematic diagram of still another modification of the conductive-contact unit according to the third embodiment; and FIG. 14 is a schematic diagram of still another modification of the conductive-contact unit according to the third embodiment.

EXPLANATIONS OF LETTERS OR NUMERALS

Figure 1:
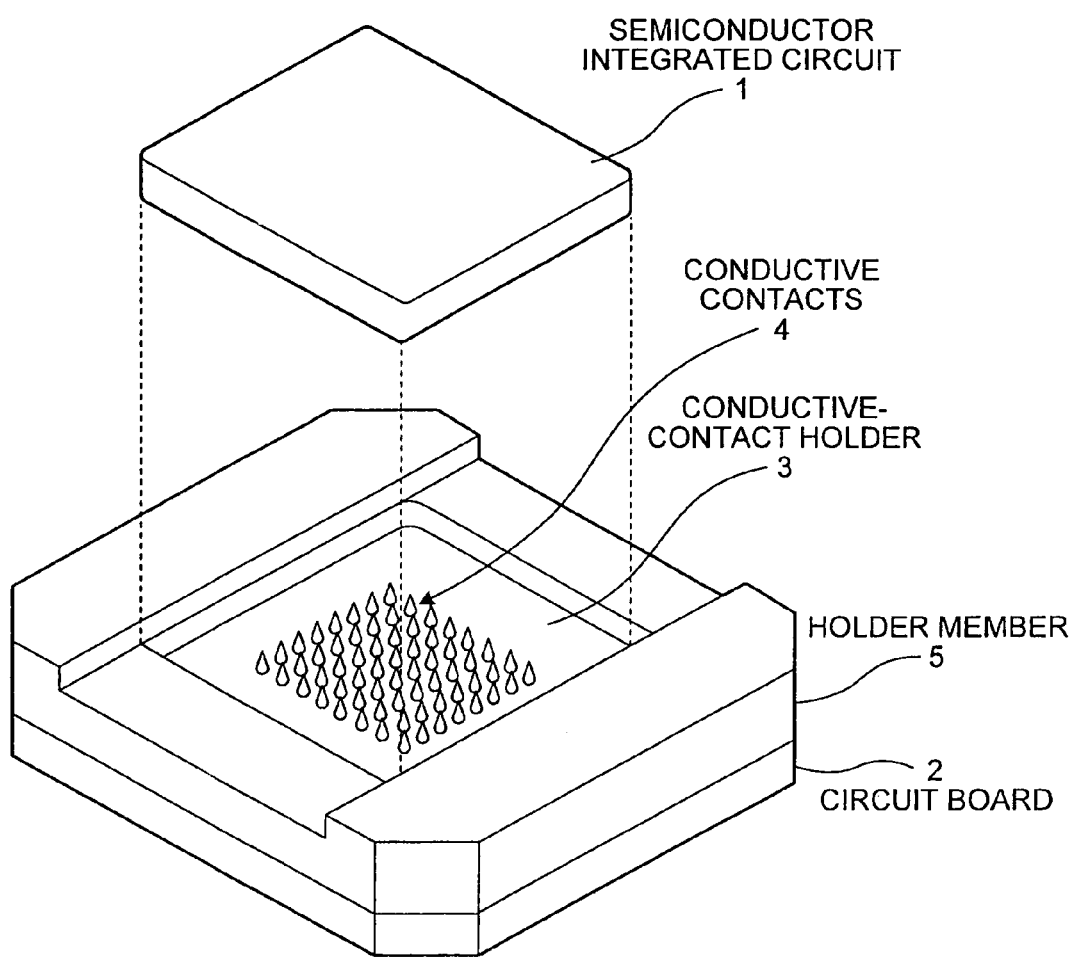
FIG. 1 is a schematic diagram of an overall structure of a conductive-contact unit according to a first embodiment of the present invention.

1 Semiconductor integrated circuit
2 Circuit board
3, 54 Conductive-contact holder
4 Conductive contact
5 Holder member
6, 29, 47, 67, 98 First substrate
7, 30, 48, 68, 99 Second substrate
8, 39, 52, 58 First opening
9, 40, 59 Second opening
10, 41, 60 Third opening
11, 28, 49, 61 Holder base
13, 14, 50, 51 Insulating member
15, 34, 55, 83 Signal conductive-contact
16, 35, 56, 84 Ground conductive-contact
17, 36, 57, 85 Power-supply conductive-contact
19, 20, 79a, 79b, 86, 87, 89, 90, 92, 93 Needle member
21, 82 Spring member
22 Electrode
23 Connection electrode
25 Screw
26 Connection cable
27 Ground-potential supply unit
31, 32 Conductive pipe member
33 Spring member
38 Holder base
44, 45 Impedance correcting member
63, 95 First insulating pipe member
64, 96 Second insulating pipe member
65 First conductive pipe member
66 Second conductive pipe member
70a, 70b Fourth opening
72, 100 Fifth opening
73a, 73b, 101 Sixth opening
74 Seventh opening
75, 76, 77, 78 Anti-slip flange
80, 81 Flange portion
88, 91, 94 Pipe body

DETAILED DESCRIPTION OF EXEMPLARY EMBODIMENTS

Exemplary embodiments of a conductive-contact holder and a conductive-contact unit according to the present invention are explained in detail below with reference to the accompanying drawings. It should be noted that the drawings are schematic and a relation between a thickness and a width of a part and a ratio between thicknesses in respective parts may be different from real ones. It is further noted that the drawings may include portions in which a relation and a ratio between dimensions are different from each other.

First Embodiment

A conductive-contact unit according to a first embodiment of the present invention is explained below. The conductive-contact unit is used to input and output electrical signals to and from a predetermined circuit configuration of a semiconductor integrated circuit or the like, and used to supply power and ground potential to the circuit configuration. Particularly, in order to supply stable ground potential, the conductive-contact unit has a structure in which a conductive contact for grounding and a conductive-contact holder are electrically connected to each other. More specifically, the conductive contact for grounding supplies ground potential, and the conductive-contact holder is formed of a conductive material.

FIG. 1 is a schematic diagram of a structure of the conductive-contact unit according to the first embodiment. The conductive-contact unit according to the first embodiment includes a circuit board 2 including a circuit that generates signals to be supplied to a semiconductor integrated circuit 1. The conductive-contact unit also includes a conductive-contact holder 3 that is disposed on the circuit board 2 and that includes predetermined openings (not shown in FIG. 1), and conductive contacts 4 accommodated in the openings of the conductive-contact holder 3. A holder member 5 used to suppress displacement of the semiconductor integrated circuit 1 during use thereof is disposed on the circuit board 2 and around the outer periphery of the conductive-contact holder 3.

The circuit board 2 includes a test circuit that tests electrical characteristics of the semiconductor integrated circuit 1 that is a target to be tested. The circuit board 2 is configured to arrange electrodes (not shown in FIG. 1) on the contact surface thereof with the conductive-contact holder 3. The electrodes are used to electrically connect the circuit included to the conductive contacts 4.

The conductive-contact holder 3 accommodates the conductive contacts 4. More specifically, the conductive-contact holder 3 includes a holder base formed of a conductive material such as metal and an insulating member for coating a necessary area on the surface of the holder base. The holder base has openings in an area corresponding to locations where the conductive contacts 4 are arranged so that the conductive contacts 4 are accommodated in the openings, respectively.

The conductive contacts 4 are used to electrically connect between a circuit in the circuit board 2 and the semiconductor integrated circuit 1. The conductive contacts 4 are divided into three patterns according to types of signals to be supplied to the semiconductor integrated circuit 1. More specifically, the conductive contacts 4 include a conductive contact for signal used to input and output electrical signals to and from the semiconductor integrated circuit 1, a conductive contact for grounding used to supply ground potential thereto, and a power-supply conductive-contact used to supply power thereto. The conductive contact for signal, the conductive contact for grounding, and the power-supply conductive-contact are generically referred to as a conductive contact or conductive contacts, while when individuals are referred to, the respective names are used.

Figure 2:
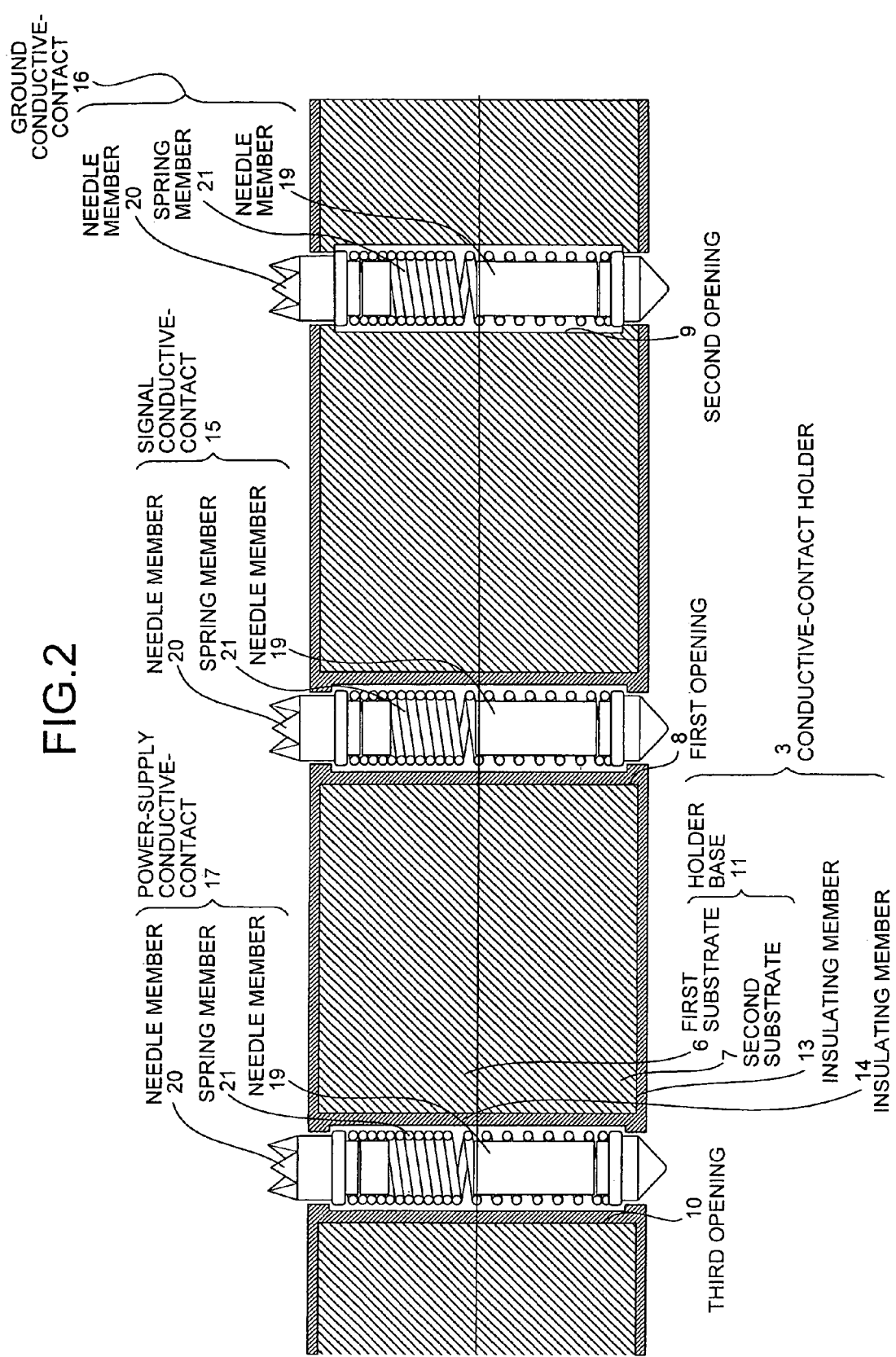
FIG. 2 is a schematic diagram of a detailed structure of a conductive-contact holder and conductive contacts that form the conductive-contact unit according to the first embodiment.

FIG. 2 is a schematic diagram of a detailed structure of the conductive-contact holder 3 and the conductive contacts 4. The conductive-contact holder 3 includes a holder base 11 configured to join a first substrate 6 and a second substrate 7 which are formed of a conductive material using a screw. The holder base 11 has a first opening 8, a second opening 9, and a third opening 10 by penetrating the first substrate 6 and the second substrate 7. The conductive-contact holder 3 also includes an insulating member 13 and an insulating member 14 for coating the internal surfaces of the first opening 8 and the third opening 10 and the surface of the holder base 11.

The holder base 11 (the first substrate 6 and the second substrate 7) is formed of a conductive material and functions as a base material of the conductive-contact holder 3. More specifically, the holder base 11 is formed of conductive metal or conductive resin. From the viewpoint of effective performance of a grounding function and an electric-field shielding function, it is preferable to use a conductive material of which volume resistivity is equal to or less than $10^{10}$ ohm-centimeters, and it is also preferable to use gun metal or beryllium copper as a specific material for the holder base 11.

The first opening 8 accommodates a signal conductive-contact 15 that inputs and outputs a signal to and from any one of connection electrodes 23a to 23c (FIG. 3) included in the semiconductor integrated circuit 1. The second opening 9 accommodates a ground conductive-contact 16 that supplies ground potential to another one of the connection electrode 23a to 23c, and the third opening 10 accommodates a power-supply conductive-contact 17 that supplies power to the rest of the electrodes 23a to 23c. These openings are formed in a cylindrical to penetrate the holder base 11, and serve as a positioning unit and a guiding unit for the conductive contact accommodated therein. The first, second, and third openings are formed by etching or punching the first substrate 6 and the second substrate 7 or by machining them using laser, electron beams, ion beams, or wire electric discharge.

Because the second opening 9 has a function of electrically contacting the ground conductive-contact 16 as explained below, it is preferable that the internal surface of the second opening 9 be treated as follows. With the treatment, the second opening 9 has a smaller electrical contact resistance with the ground conductive-contact 16 accommodated therein and has abrasion resistance against the expansion and contraction operation of the ground conductive-contact 16. More specifically, in the conductive-contact unit according to the first embodiment, gold plating or the like is subjected to the internal surface of the second opening 9, which allows the electrical contact resistance between the second opening 9 and the ground conductive-contact 16 to be reduced and the abrasion resistance to be improved.

The first opening 8 and the third opening 10 are formed so that the respective inner diameters thereof are made larger than the internal diameter of the second opening 9 by the thickness of the insulating member 13 and the insulating member 14 that are provided inside the openings. The second opening 9 is formed to be almost the same as the outer diameter of the ground conductive-contact 16 to perform a guiding function and the grounding function. The reason that the first opening 8 and the third opening 10 are thus formed is because they have the function of accommodating the signal conductive-contact 15 and the power-supply conductive-contact 17, respectively, through the insulating member 13 and the insulating member 14.

The first opening 8, the second opening 9, and the third opening 10 are formed so that the respective internal diameters are narrowed near the outer surfaces of the holder base 11 in the top and the bottom thereof to function as an anti-slip off device for preventing the conductive contact from slipping off. Because the conductive contact has projections as the anti-slip off device, as explained later, the internal diameter of each opening is narrowed near the upper and the lower surfaces so that the projection and the opening are brought into contact with each other. Because the internal diameter of each opening in the upper and the lower surfaces is narrowed, the structure as follows is employed for the holder base 11. In order to enable accommodation of the conductive contacts in the first opening 8 and the like upon manufacturing, the first substrate 6 and the second substrate 7 are joined to each other to form the holder base 11.

The insulating members 13 and 14 are formed inside the first opening 8 and the third opening 10 to electrically insulate the signal conductive-contact 15 and the power-supply conductive-contact 17 from the holder base 11. The insulating members 13 and 14 are also formed on the outer surface of the holder base 11 to electrically insulate the semiconductor integrated circuit 1 and the circuit board 2 from the holder base 11. In the first embodiment, the material forming the insulating members 13 and 14 and the thickness thereof are not particularly specified. Therefore, any material with any thickness may be used to form the insulating members 13 and 14 if it can perform the insulating function sufficiently. It is noted that the insulating members 13 and 14 are formed as a film by means of coating. As a specific example of the coating, it is possible to use calendaring, extruding, dipping, spray, spread, and electro-deposition. The insulating members 13 and 14 may be formed using the method of chemical-vapor deposition (CVD). Furthermore, the insulating members 13 and 14 may be formed of an oxide film of anodized aluminum or the like.

The structure of the conductive contact is explained below. Specific structures of the signal conductive-contact 15, the ground conductive-contact 16, and the power-supply conductive-contact 17 can be assumed the same as one another though they have different functions from one another. Therefore, the structure of the signal conductive-contact 15 is explained below as a typical example.

The signal conductive-contact 15 includes a needle member 19 for being electrically connected to an electrode provided in the circuit board 2, and a needle member 20 for being electrically connected to a connection electrode provided in the semiconductor integrated circuit 1 upon use. The signal conductive-contact 15 also includes a spring member 21 provided between the needle member 19 and the needle member 20, used to electrically connect between the needle member 19 and the needle member 20, and also used to expand and contract the signal conductive-contact 15 in its longitudinal direction. The needle member 19, the needle member 20, and the spring member 21 are accommodated in the first opening 8 so that the respective axes thereof correspond to the axis of the first opening 8, and the three members are movable along the axial direction.

The needle member 19 is provided to be electrically connected to an electrode disposed on the surface of the circuit board 2. More specifically, the needle member 19 has a "tip end" in the side of the circuit board 2 thereof, and the tip end comes in contact with the electrode provided in the circuit board 2. Because the needle member 19 can move along the axial direction by expansion and contraction of the spring member 21, the needle member 19 can be made in contact with the electrode provided in the circuit board 2 in the most appropriate state corresponding to irregularities of the electrode, and can be made in contact with the electrode in a state where contact resistance is reduced by pushing force in the expansion direction of the spring member 21.

The needle member 19 has a projection projecting in a direction perpendicular to the axis as shown in FIG. 2. As explained above, because the internal diameter of the first opening 8 is narrowed near the lower surface of the holder base 11, the projection and the insulating member 13 provided inside the first opening 8 come in contact with each other with downward movement of the needle member 19, which makes it possible to prevent the needle member 19 from slipping off.

The needle member 20 is used to be electrically connected to the connection electrode provided in the semiconductor integrated circuit 1 when the conductive-contact unit according to the first embodiment is used. More specifically, the needle member 20 is in contact with the connection electrode at the edge of the needle member 20 on the side of the semiconductor integrated circuit 1. The needle member 20 is movable in the axial direction by the expansion and the contraction of the spring member 21 in the same manner as that of the needle member 19, and has the projection projecting in the direction perpendicular to the axis thereof to function as the anti-slip off device. With the structure, the conductive contact electrically connects between the electrode in the circuit board 2 and the connection electrode in the semiconductor integrated circuit 1.

Figure 3:
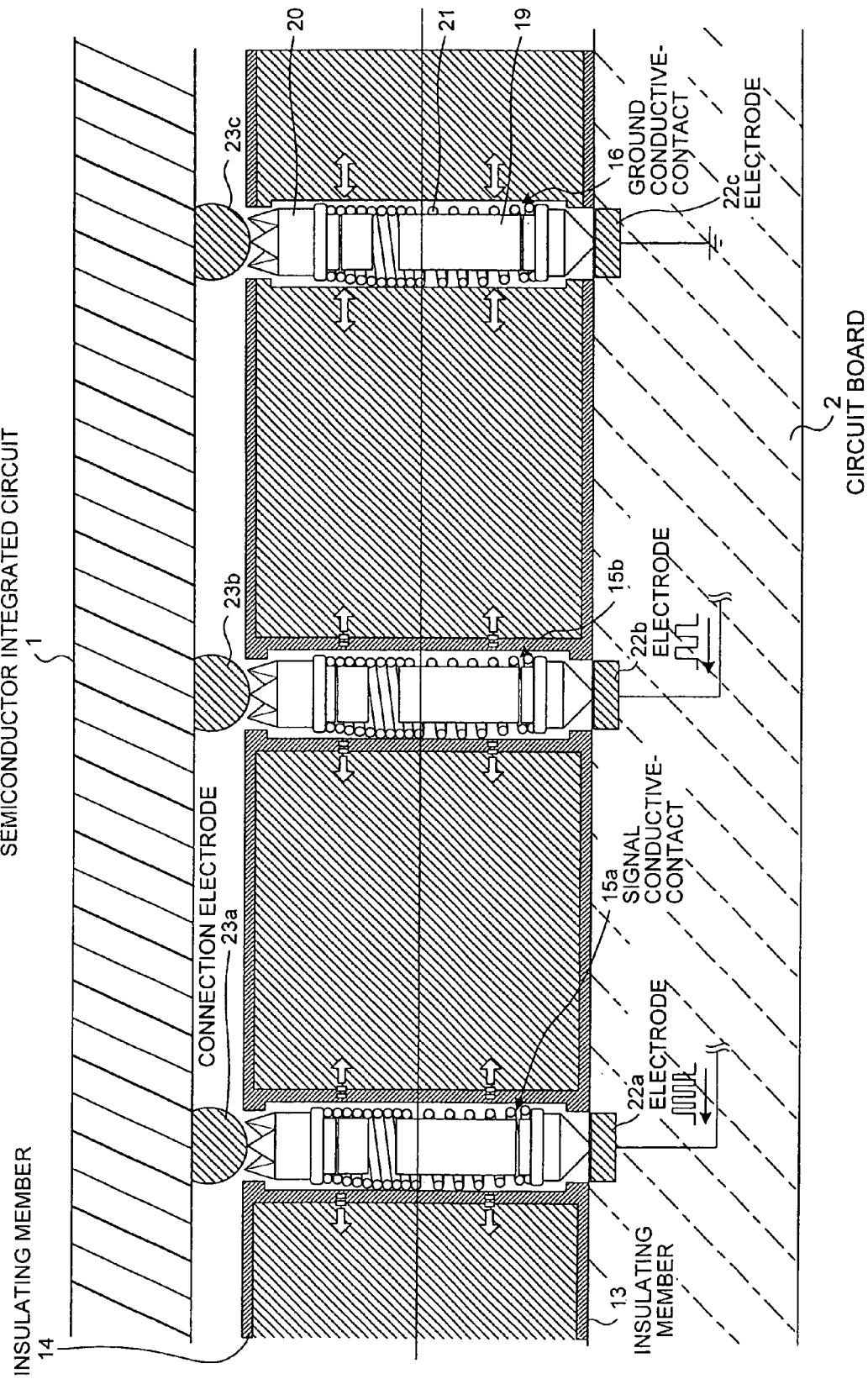
FIG. 3 is a schematic diagram for explaining an advantage of the conductive-contact unit according to the first embodiment.

Some advantages of the conductive-contact unit according to the first embodiment are explained below. FIG. 3 is a schematic diagram for explaining "electrical interaction" between the conductive contacts and the conductive-contact holder when the conductive-contact unit according to the first embodiment is used. As shown in FIG. 3, a conductive contact 15a for signal and a conductive contact 15b for signal are provided adjacent to each other to facilitate explanation of the advantages of the conductive-contact unit.

Electrical action in the ground conductive-contact 16 is explained below. The ground conductive-contact 16 according to the first embodiment is configured to supply potential from the circuit board 2 to the semiconductor integrated circuit 1 through an electrode 22c, and receive potential from the holder base 11 to supply ground potential to the semiconductor integrated circuit 1. In other words, as also shown in FIG. 2, in the holder base 11, no coating of an insulating member is formed on the inner surface of the second opening 9 that accommodates the ground conductive-contact 16. Therefore, the inner surface of the second opening 9 comes in direct contact with the outer periphery of the ground conductive-contact 16. More specifically, as shown in FIG. 3, the inner surface of the second opening 9 comes in direct contact with the spring member 21 bent with its contraction operation. Because the holder base 11 is formed of the conductive material, the ground conductive-contact 16 and the holder base 11 are electrically connected to each other. Therefore, internal charges can freely move between the ground conductive-contact 16 and the holder base 11, and therefore, the potential supplied by the ground conductive-contact 16 and the potential of the holder base 11 become an equal value to each other.

The ground conductive-contact 16 has an extremely fine structure with miniaturization of the semiconductor integrated circuit 1, while the holder base 11 has capacity to such an extent that it can accommodate the conductive contacts by hundreds to thousands of units. Therefore, the individual conductive contacts have such a small size that is negligible for the holder base 11. Consequently, fluctuations in potential of the holder base 11 produced by electric charge applied from such fine conductive contacts can be assumed almost zero. When predetermined electric charge flows through the ground conductive-contact 16 from the semiconductor integrated circuit 1, the electric charge is promptly discharged and dispersed to the holder base 11. As a result, the potential of the ground conductive-contact 16 and the holder base 11 can be maintained at ground potential. Based on the structure, the ground conductive-contact 16 electrically contacts the holder base 11 formed of the conductive material, which allows the potential of the ground conductive-contact 16 to be maintained stably at ground potential.

There is another advantage by which the whole outer periphery of the ground conductive-contact 16 is made in contact with the second opening 9 formed in the holder base 11. More specifically, the ground conductive-contact 16 is cylindrically formed as a whole as shown in FIG. 2, and the area of the outer periphery thereof becomes significantly large as compared with the area of the cross section thereof perpendicular to the axis. Therefore, by causing the ground conductive-contact 16 to be supplied with ground potential through the outer periphery, a contact area with a ground-potential supply source (i.e., the holder base 11) can be increased. As a result, the conductive-contact unit according to the first embodiment has such an advantage that electrical contact resistance between the ground-potential supply source and the ground conductive-contact 16 can be reduced, and that ground potential can thereby be efficiently supplied to the ground conductive-contact 16.

The electrical action in the conductive contacts 15a and 15b for signal and near these contacts is explained below. The conductive contacts 15a and 15b for signal are used to receive electrical signals generated in the circuit board 2 through electrodes 22a and 22b and to input and output the electrical signals received to and from the semiconductor integrated circuit 1. When the electrical signal passes through the conductive contact 15a for signal, an electromagnetic wave corresponding to the electrical signal that is passing is produced inside the conductive contact 15a for signal and is emitted to the outside. When such an electromagnetic wave is input to the conductive contact 15b for signal, the waveform of the electrical signal input or output by the conductive contact 15b for signal may fluctuate. Consequently, if the space between the conductive contacts in particular is narrowed, it is necessary to provide the mechanism of shielding the electromagnetic waves.

On the other hand, in the conductive-contact unit according to the first embodiment, the holder base 11 having conductivity is arranged corresponding to the conductive contacts 15a and 15b for signal through the insulating member 13 and the insulating member 14. Therefore, it is possible to cause the holder base 11 to shield the electromagnetic waves. As explained above, it can be assumed that the potential of the holder base 11 is maintained at almost ground potential, i.e., at a constant potential. Consequently, the electromagnetic waves produced in the conductive contacts 15a and 15b for signal are absorbed by the holder base 11, which makes it possible to suppress propagation of the electromagnetic wave produced in either one of the conductive contacts 15a and 15b for signal, to the other. Therefore, even if the conductive-contact unit according to the first embodiment includes the conductive contacts for signal between which space is narrowed, it is possible to suppress influence to an allowable level. The influence is such that the operation of one side is affected by the electromagnetic wave produced in the other side.

The same goes for the case where an electromagnetic wave is produced by a factor other than the conductive contact. For example, even if there is an electromagnetic wave source such as a mobile phone near the conductive-contact unit according to the first embodiment, the holder base 11 around the conductive contact can suppress an electromagnetic wave that flows into the conductive contact.

The function of shielding the electromagnetic waves is performed in the same manner as explained above in the signal conductive-contact 15 and the power-supply conductive-contact 17. In other words, even if the electromagnetic wave is produced by the power passing through the power-supply conductive-contact 17, the bad influence exerted over other conductive contacts can be controlled by the shielding function of the holder base 11. In addition, even if the electromagnetic wave is produced by any conductive contact other than the power-supply conductive-contact 17, the bad influence exerted over the power-supply conductive-contact 17 can be controlled by the shielding function of the holder base 11.

Furthermore, there is another advantage obtained by forming the holder base 11 with a metal material. When the holder base is formed of an insulating resin material, a thermal expansion coefficient of the semiconductor integrated circuit 1 is not necessarily coincident with a thermal expansion coefficient of the holder base 11, and a displacement may occur, according to changes in temperature, in a positional relationship between the connection electrode of the semiconductor integrated circuit 1 and the conductive contact accommodated in the holder base 11.

However, when the holder base 11 is formed of a metal material such as an Invar (Registered Trademark) material or a covar (Registered Trademark) material, the thermal expansion coefficient of the holder base 11 can be made approximate to the thermal expansion coefficient of silicon that is the base material of the semiconductor integrated circuit 1. In other words, there is another advantage of enabling realization of the conductive-contact holder and the conductive-contact unit that can be used stably irrespective of changes in temperature, by forming the holder base 11 using any adequate metal material. The holder base 11 formed is appropriate for the thermal expansion coefficient of a predetermined circuit configuration in the semiconductor integrated circuit 1.

There is another advantage that it is possible to suppress deformation due to influence of outside air when the holder base 11 is formed of a metal material. In other words, when the metal material is used, it is possible to suppress expansion and contraction of the holder base 11 by absorption of water existing in outside air and to suppress occurrence of permanent change in dimensions due to chemical reaction with a predetermined component in outside air. Therefore, the conductive-contact unit according to the first embodiment allows deformation due to influence of outside air to be minimized, and also allows displacement in the positional relationship between the connection electrode and the conductive contact to be prevented.

Furthermore, by using the metal material, the strength of the holder base 11 can be improved. With the improved strength, the conductive-contact unit according to the first embodiment has another advantage that even if a large number of openings are made in the holder base 11 to accommodate the conductive contacts therein, occurrence of warping in the holder base 11 can be prevented by the reaction force of the conductive contacts.

As explained above, in the conductive-contact unit according to the first embodiment, the holder base 11 formed of the conductive material is provided for the base material of the conductive-contact holder 3 that accommodates the conductive contacts. It is thereby possible to achieve efficiency of the function of supplying ground potential in the ground conductive-contact 16, and to perform the function of shielding the electromagnetic waves that may be input to the signal conductive-contact 15 and the power-supply conductive-contact 17. These functions largely depend on potential stability of the holder base 11. Therefore, by increasing the potential stability of the holder base 11, the function of supplying ground potential and the function of shielding the electromagnetic waves can be increased.

Figure 4:
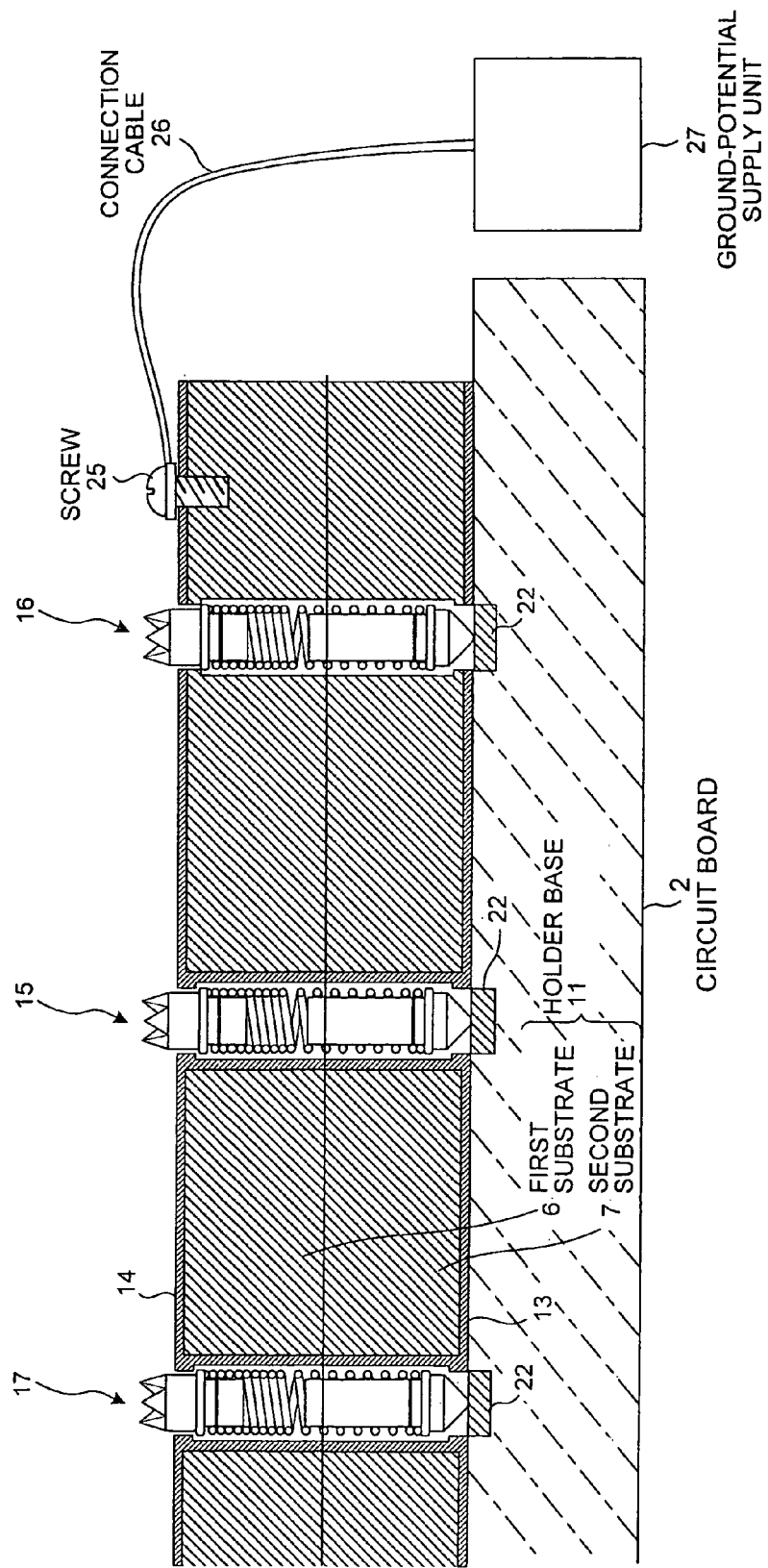
FIG. 4 is a schematic diagram of a modification of the conductive contact unit according to the first embodiment.

FIG. 4 is a schematic diagram of a modified conductive-contact unit that can further improve the potential stability of the holder base 11. In the modified conductive-contact unit, the holder base 11 is electrically connected to one end of a connection cable 26 with a screw 25. The other end of the connection cable 26 is connected to a ground-potential supply unit 27.

The ground-potential supply unit 27 includes a constant potential source and supplies ground potential to the holder base 11 through the connection cable 26. Therefore, the potential of the holder base 11 can be maintained forcefully at ground potential from the outside by the ground-potential supply unit 27, which allows the potential to be further stabled. Thus, the modified conductive-contact unit of FIG. 4 has such an advantage that the function of supplying ground potential of the ground conductive-contact 16 and the function of shielding the electromagnetic waves can further be improved.

Figure 5:
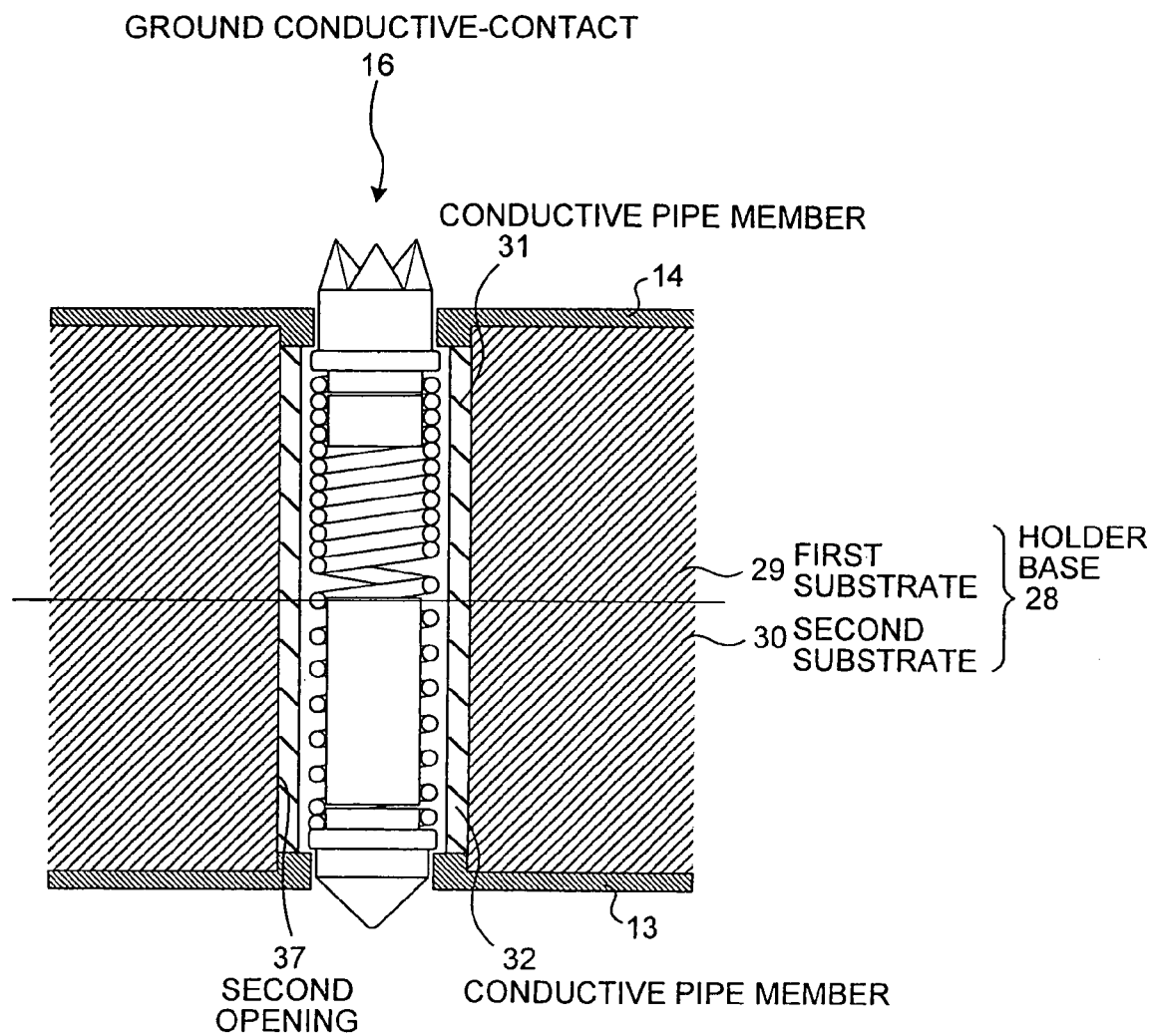
FIG. 5 is a schematic diagram of another modification of the conductive-contact unit according to the first embodiment.

In order to improve the function of supplying ground potential of the ground conductive-contact 16, it is useful that a conductive member having a smooth contact surface with the ground conductive-contact 16 is arranged around the outer periphery of the ground conductive-contact 16. FIG. 5 is a schematic diagram of a partial structure of a modified conductive-contact unit obtained by providing such alteration to the conductive-contact unit according to the first embodiment. In the modified conductive-contact unit of FIG. 5, a second opening 37 is made in a first substrate 29 and a second substrate 30 that form a holder base 28. The second opening 37 is formed so that the internal diameter thereof is made larger than that of the second opening 9 as shown in FIG. 2. The modified conductive-contact unit has a structure such that conductive pipe members 31 and 32 are inserted between the inside of the second opening 37 and the outer periphery of the ground conductive-contact 16.

The conductive pipe members 31 and 32 are cylindrically formed and are coaxially arranged so that the inside of the cylindrical shape is in contact with the outer periphery of the ground conductive-contact 16 and the outside of the cylindrical shape is in contact with the inside of the second opening 37. In other words, the conductive pipe members 31 and 32 are supplied with potential of the holder base 28, i.e., with ground potential by being in contact with the inside of the second opening 37. At the same time, the conductive pipe members 31 and 32 have the function of supplying ground potential to the ground conductive-contact 16 by being in contact with the outer periphery of the ground conductive-contact 16.

The conductive pipe members 31 and 32 have a pipe structure as a base material formed of cupronickel, phosphor bronze, brass, or stainless steel, and a golden thin board is stuck to the inside of the pipe structure. For example, this structure is formed by previously sticking the golden thin board to a board of cupronickel or the like, rounding the board so that the golden thin board becomes an inside, and drawing the board to a pipe with a small diameter. The conductive pipe members 31 and 32 may be formed by subjecting the inside of the pipe structure to gold plating.

The reason of using the conductive pipe members 31 and 32 in the modified conductive-contact unit of FIG. 5 is explained below. The conductive-contact unit according to the first embodiment is structured to electrically connect the ground conductive-contact 16 to the inside of the second opening formed in the holder base to thereby supply ground potential to the ground conductive-contact 16. Therefore, in the first embodiment, as also shown in FIG. 2, the ground conductive-contact 16 is accommodated in the second opening 9 in a state of being in a physical contact with the inside of the second opening 9. The ground conductive-contact 16 is thereby supplied with ground potential through the contact portion with the inside of the second opening 9, and performs the expansion and contraction maintaining the state of being in contact with the inside of the second opening 9.

However, the diameter of the opening has reached an extremely small value by miniaturization of the conductive contact according to miniaturization of the semiconductor integrated circuit 1 in recent years. This makes it not easy to form the opening. Even if the opening with the small diameter is made, it is also difficult to prevent minute irregularities from being produced in the inside of the opening. Therefore, if the conductive contact is made in direct contact with the inside of the opening, resistance due to the expansion and contraction of the conductive contact and electrical contact resistance between the outer periphery of the conductive contact and the inside of the opening may increase.

Consequently, in the modified conductive-contact unit of FIG. 5, the conductive pipe members 31 and 32 with a smooth internal surface are inserted between the second opening 37 and the ground conductive-contact 16. With this structure, the modified conductive-contact unit is advantageous in that operation resistance due to the expansion and contraction of the ground conductive-contact 16 is reduced and electrical contact resistance on the outer periphery of the ground conductive-contact 16 is reduced.

Figure 6:
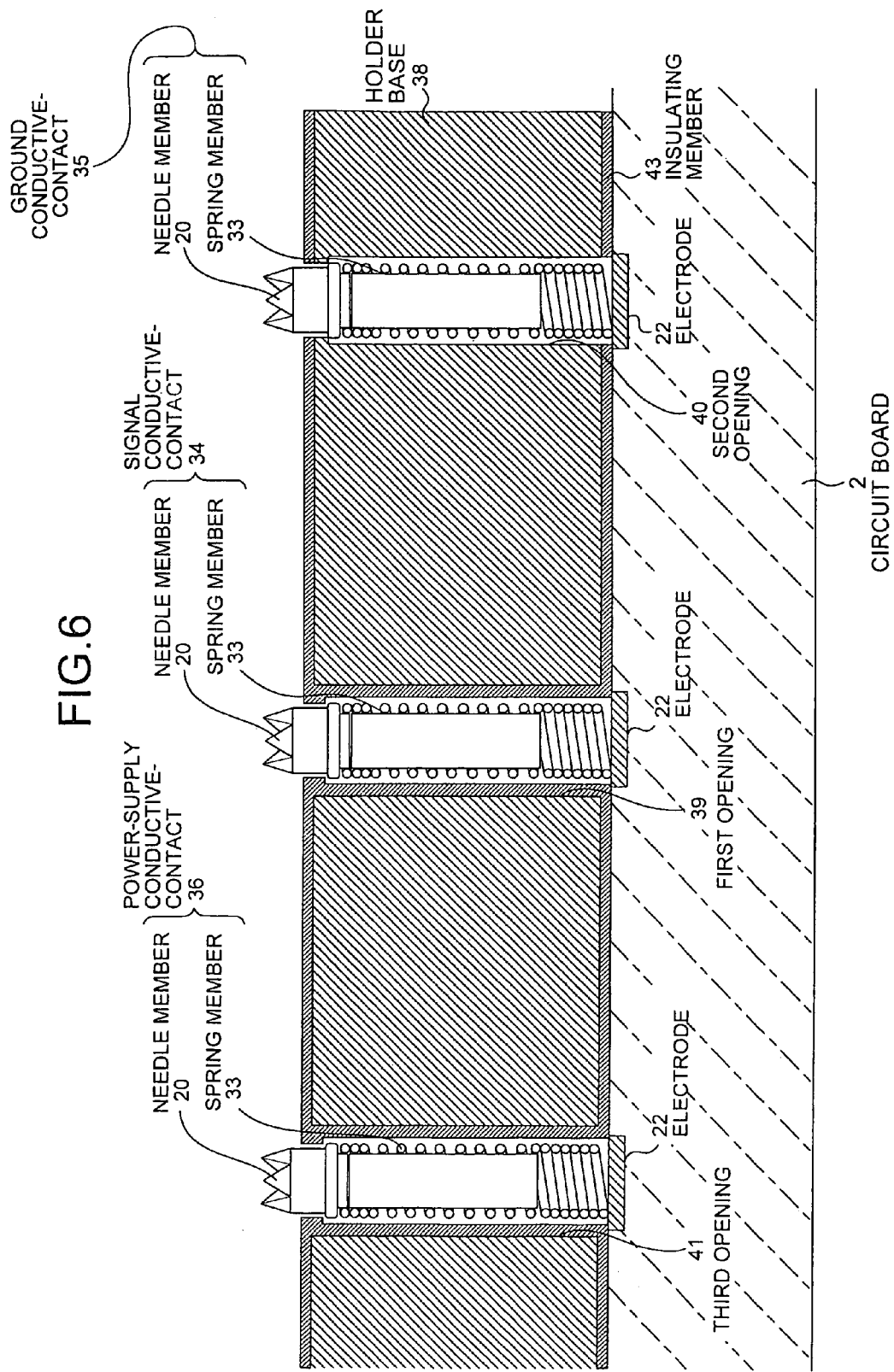
FIG. 6 is a schematic diagram of still another modification of the conductive-contact unit according to the first embodiment.

It is also useful that the structures of the conductive contacts and the holder base are simplified. FIG. 6 is a schematic diagram of a structure of a modified conductive-contact unit. In the modified conductive-contact unit of FIG. 6, each of a signal conductive-contact 34, a ground conductive-contact 35, and a power-supply conductive-contact 36 includes a spring member 33 and the needle member 20. More specifically, the needle member 19 of FIG. 2 provided in the side in contact with the circuit board 2 is omitted, and electrical contact between the conductive contact and an electrode 22 is performed by the spring member 33.

The reason why the conductive contact has the structure without a member corresponding to the needle member 19 of FIG. 2 is as follows. In the structure of FIG. 2, the needle member 19 has a function for electrical contact with the electrode structure included in the circuit board 2 and further has a projection in the direction perpendicular to the axial direction. This projection serves as a function of preventing the conductive contact from slipping off in a downward direction. In contrast, by making the conductive-contact holder and the circuit board 2 in close contact with each other, the conductive contact can be prevented from slipping off. Therefore, the modified conductive-contact unit of FIG. 6 has the structure without the member corresponding to the needle member 19 of FIG. 2. Consequently, the modified conductive-contact unit is advantageous in that the number of components of the conductive contact can be reduced to allow its simplified structure.

The modified conductive-contact unit is further advantageous in that a holder base 38 can be formed with a single substrate by omitting the needle member 19. In other words, there is no need to narrow the internal diameter of each opening made in the holder base 38 near the lower surface of the opening to prevent the conductive-contact unit from slipping off. Therefore, there is no difficulty of accommodating the conductive contact in the opening unlike the structure of FIG. 2, and therefore, the conductive contact can easily be fitted in the opening from the lower side of the holder base 38. This does not require the holder base to be formed of two substrates. As a result, in modified conductive-contact unit, the holder base 38 is formed of the single substrate, which makes it possible to reduce a burden on manufacturing.

Second Embodiment

A conductive-contact unit according to a second embodiment of the present invention is explained below. The conductive-contact unit according to the second embodiment includes at least a conductive contact for signal. In the second embodiment, an impedance correcting member is arranged between the inside of a first opening for accommodating the conductive contact for signal and the outer periphery of the conductive contact for signal. The impedance correcting member corrects a value of intrinsic impedance in the conductive contact for signal.

Figure 7:
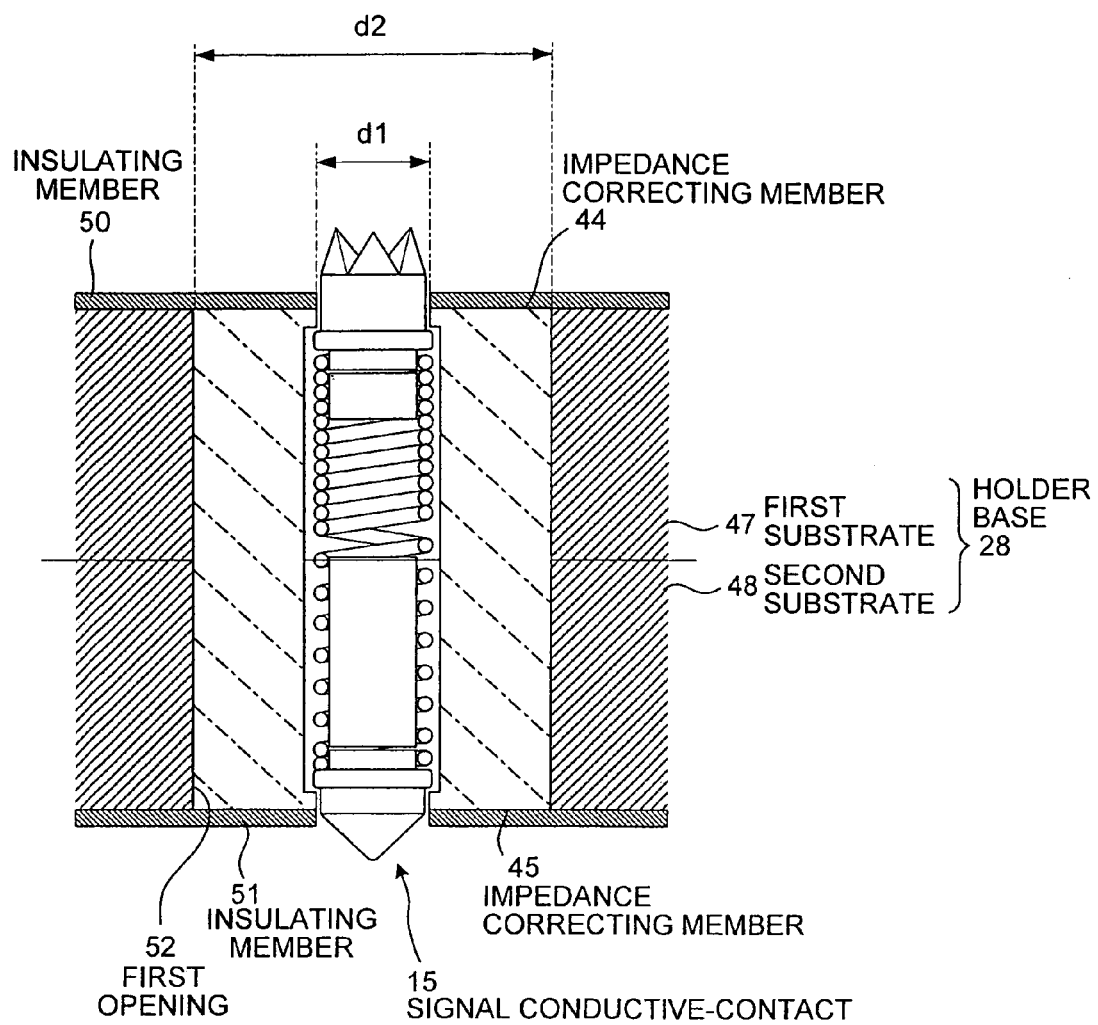
FIG. 7 is a schematic diagram of a partial structure of a conductive-contact unit according to a second embodiment of the present invention.

FIG. 7 is a schematic diagram of a partial structure around the signal conductive-contact 15, of the conductive-contact unit according to the second embodiment. In the conductive-contact unit according to the second embodiment, the components such as the circuit board 2 and the holder member 5 excluding the conductive-contact holder are the same as these in the first embodiment, and are operated in the same manner as that of the first embodiment unless otherwise mentioned below.

As shown in FIG. 7, the conductive-contact unit according to the second embodiment includes a holder base 49 that includes a first substrate 47 and a second substrate 48 in which a first opening 52 is made to accommodate the signal conductive-contact 15 therein. The conductive-contact unit according to the second embodiment includes an insulating member 50 provided on the outer surface of the holder base 49 in the upper side and an insulating member 51 provided on the outer surface of the holder base 49 in the lower side. The conductive-contact unit also includes an impedance correcting member 44 and an impedance correcting member 45 provided between the inside of the first opening 52 and the signal conductive-contact 15.

The impedance correcting members 44 and 45 are obtained by cylindrically forming a dielectric material having a predetermined dielectric constant, and are used to correct the values of intrinsic impedance in the signal conductive-contact 15. More specifically, the impedance correcting members 44 and 45 control a dielectric constant of the dielectric material and the outer diameter of the cylindrical shape to correct the intrinsic impedance in the signal conductive-contact 15 to match the intrinsic impedance of the semiconductor integrated circuit 1.

A more specific relation between the structure of the impedance correcting members 44 and 45 and the intrinsic impedance in the signal conductive-contact 15 is explained below. A value of intrinsic impedance $Z_0$ in the signal conductive-contact 15 is given by Equation (1), where $\in_r$ is a specific dielectric constant of the dielectric material that forms the impedance correcting members 44 and 45, $d_2$ is an outer diameter of the cylindrical shape, and $d_1$ is an outer diameter of the signal conductive-contact 15.

[Equation 1]

$$Z_0 = \frac{138}{\sqrt{\varepsilon_r}} \log_{10} \frac{d_2}{d_1} \quad (1)$$

Assume that polyethylene is used as the dielectric material of the impedance correcting members 44 and 45, the outer diameter of the signal conductive-contact 15 is set to 0.4 millimeter, and the intrinsic impedance in the signal conductive-contact 15 is set to 50 ohms. Based on this assumption, it is considered how the value of the intrinsic impedance in the signal conductive-contact 15 is made to match the semiconductor integrated circuit 1. Because the specific dielectric constant of the polyethylene is 0.23, it is derived, by substituting these values in Equation (1), that the outer diameter of the impedance correcting members 44 and 45 may be set to 1.4 millimeters. As a result, by realizing the structure, the value of the intrinsic impedance in the signal conductive-contact 15 can be corrected to 50 ohms.

In the second embodiment, some advantages obtained as a result of correcting intrinsic impedance in the signal conductive-contact 15 using the impedance correcting members 44 and 45 are explained below. Generally, it is known that in electronic circuits for handling alternating signals, a signal is reflected by an amount according to a ratio between different impedances at a location where interconnects having different impedances are connected to each other and the signal is thereby prevented from its propagation. The same goes for the relation between the semiconductor integrated circuit 1 and the signal conductive-contact 15 to be used. If the intrinsic impedance of the semiconductor integrated circuit 1 has a value largely different from that of the intrinsic impedance of the signal conductive-contact 15, it is difficult to input and output electrical signals even though they are electrically connected to each other.

It is known that the level of signal reflection produced at a connecting location caused by the difference between the intrinsic impedances becomes visible according to an "electrical length" (the length of a propagation path with respect to the frequency of an electrical signal) of the signal conductive-contact 15. In other words, in the conductive-contact unit according to the second embodiment, the level of reflection of the electrical signal becomes visible along with speedup of the operation of the semiconductor integrated circuit 1, i.e., with higher frequency thereof. Therefore, when the conductive-contact unit corresponding to the semiconductor integrated circuit 1 that drives at high frequency is to be manufactured, it is important to cause the value of intrinsic impedance of the signal conductive-contact 15 to match that of the semiconductor integrated circuit 1. In other words, it is important to perform impedance matching with high precision.

However, it is not easy to change the shape of the signal conductive-contact 15, from the viewpoint of performance of impedance matching. The signal conductive-contact 15 is originally restricted by some factors. The factors are such that the outer diameter is suppressed to 1 millimeter or less and the signal conductive-contact 15 has a complicated shape with the needle members 19 and 20 and the spring member 21. Consequently, it becomes difficult to change the shape to a shape suitable for impedance matching from the viewpoint of designing and manufacturing.

Therefore, in the second embodiment, the structure of the signal conductive-contact 15 is not changed but the impedance correcting members 44 and 45 formed of dielectric material are arranged around the signal conductive-contact 15 to correct the value of intrinsic impedance. By correcting the value in the above manner, the conventional structure of the signal conductive-contact 15 can be used, which makes it possible to prevent an increase in the number of components in designing and manufacturing.

Furthermore, new provision of the impedance correcting members 44 and 45 does not cause the burden on the designing and manufacturing to increase. The impedance correcting members 44 and 45 have a structure such that a cylindrical member is formed along the inside of the first opening 52. The first opening 52 is formed and the cylindrical member is formed by accumulating the dielectric material using the CVD method. Accumulation of the dielectric film by the CVD method is widely used in the field of micromachining and the technology of accurately controlling a film thickness has been established. Accordingly, the impedance correcting members 44 and 45 can easily be manufactured.

As explained above, in the conductive-contact unit according to the second embodiment, by providing the impedance correcting members 44 and 45, it is possible to perform impedance matching with the semiconductor integrated circuit 1 to be used with high precision. Furthermore, it is also possible to realize a conductive-contact unit that supports further speedup of the semiconductor integrated circuit 1 estimated in the future. The impedance correcting members 44 and 45 are realized with a simple structure, which allows excellent characteristics of the conductive-contact unit according to the second embodiment to be realized without an increase in manufacturing costs.

Figure 8:
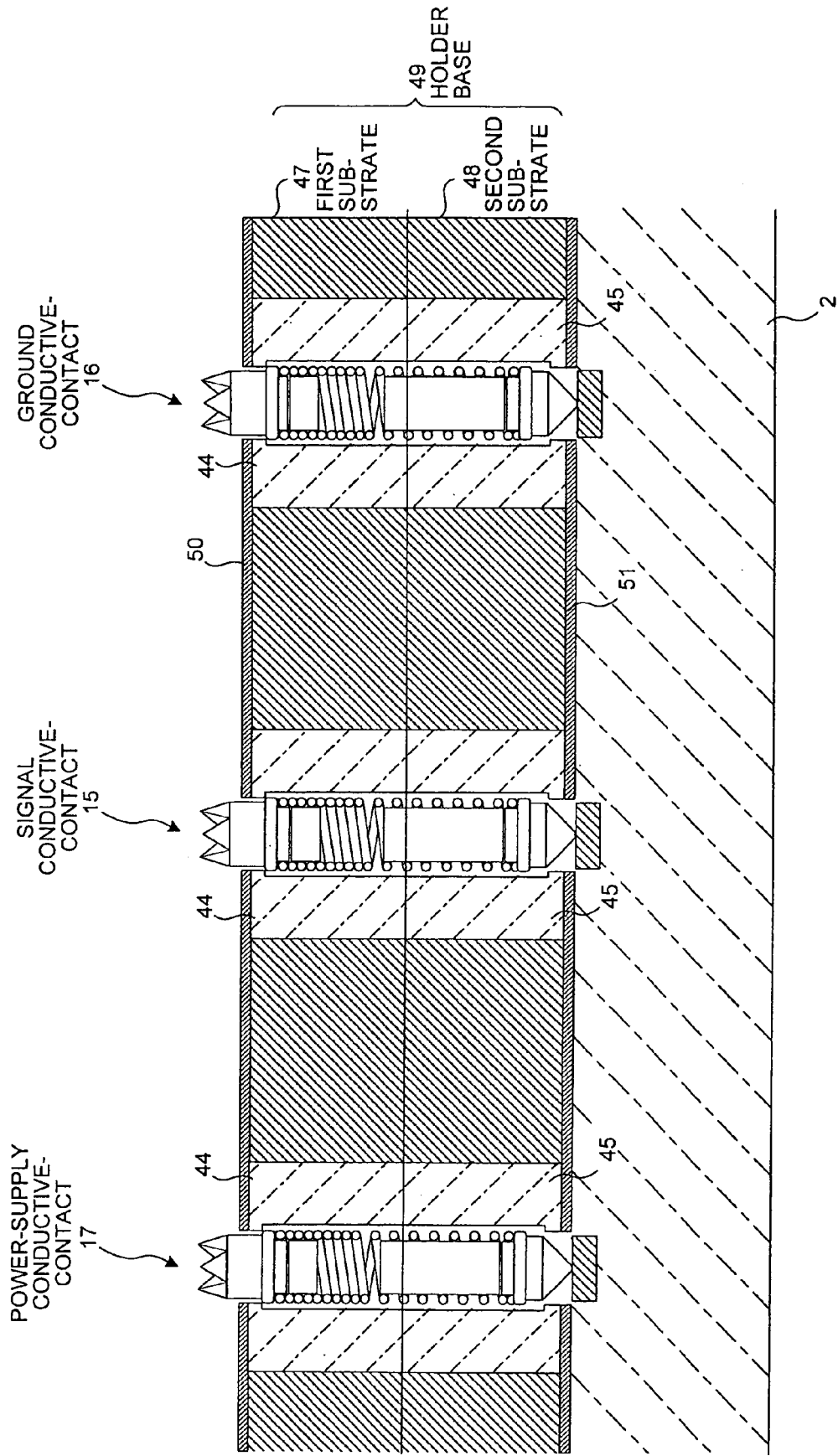
FIG. 8 is a schematic diagram of an overall structure of the conductive-contact unit according to the second embodiment.

FIG. 8 is a schematic diagram of an example of an overall structure of the conductive-contact unit according to the second embodiment. As a simple structure, it is preferable to cause the structures near openings to be the same as one other. More specifically, the openings accommodate the signal conductive-contact 15, the ground conductive-contact 16, and the power-supply conductive-contact 17, respectively. In other words, by uniformly forming the openings without any difference made according to each function of the conductive contacts, the burden on manufacturing can be reduced. Even if the structure is formed in the above manner, the intrinsic impedance in the signal conductive-contact 15 can be corrected.

Third Embodiment

A conductive-contact unit according to a third embodiment of the present invention is explained below. In the conductive-contact unit according to the third embodiment, another type of structure is employed, keeping the advantages as explained in the first and the second embodiments. The structure has an advantage in its mass-productiveness and prevention of detrimental effects due to a manufacturing error.

Figure 9:
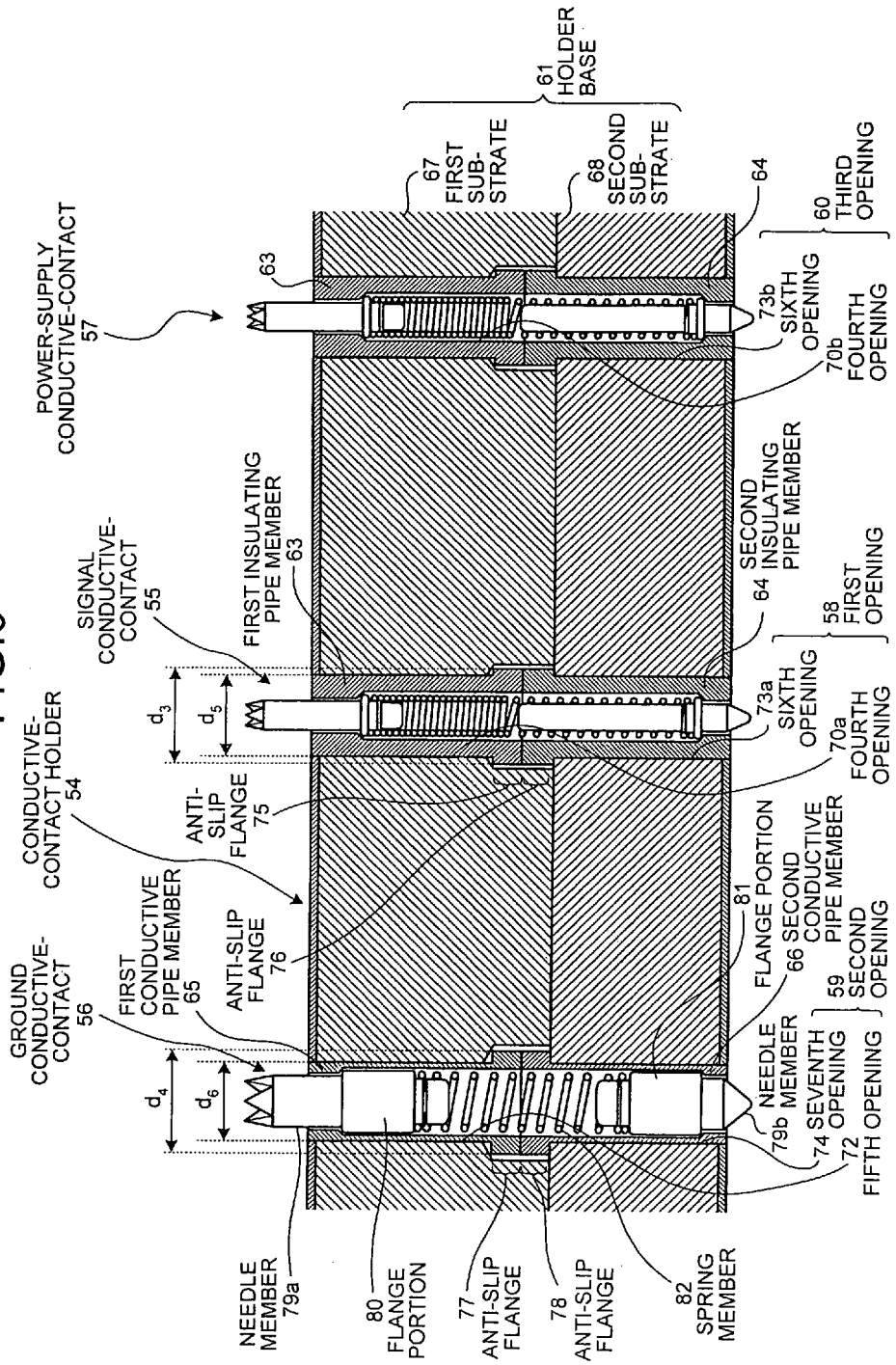
FIG. 9 is a schematic diagram of a structure of a conductive-contact unit according to a third embodiment of the present invention.

FIG. 9 is a schematic diagram of a structure of the conductive-contact unit according to the third embodiment. The conductive-contact unit according to the third embodiment includes a conductive-contact holder 54, and a signal conductive-contact 55, a ground conductive-contact 56, and a power-supply conductive-contact 57 that are accommodated in the conductive-contact holder 54. Although the circuit board 2 and the holder member 5 are not shown in FIG. 9, the conductive-contact unit according to the third embodiment has the same components as these in the first and the second embodiment.

The conductive-contact holder 54 is used to accommodate the ground conductive-contact 56 and the like. More specifically, the conductive-contact holder 54 includes a holder base 61 in which a first opening 58, a second opening 59, and a third opening 60 are made. The conductive-contact holder 54 also includes a first insulating pipe member 63 and a second insulating pipe member 64 both of which are inserted into the first opening 58 and are also inserted into the third opening 60. The conductive-contact holder 54 further includes a first conductive pipe member 65 and a second conductive pipe member 66 both of which are inserted into the second opening 59.

The holder base 61 is formed of a conductive material, and has the openings formed therein to accommodate conductive contacts in the respective openings. More specifically, in the holder base 61, the signal conductive-contact 55 is accommodated in the first opening 58, the ground conductive-contact 56 is accommodated in the second opening 59, and the power-supply conductive-contact 57 is accommodated in a third opening 60.

The holder base 61 has such a structure that a plurality of substrates are stuck to each other. The substrates are formed of the conductive material in the same manner as that of the first and the second embodiments. More specifically, the holder base 61 includes a first substrate 67 and a second substrate 68 both of which are formed of the conductive material. The first substrate 67 has a fourth opening 70a formed in a region corresponding to the region where the first opening 58 is made, and also has a fourth opening 70b formed in a region corresponding the region where the third opening 60 is made. The first substrate 67 also has a fifth opening 72 formed in a region corresponding to the region where the second opening 59 is made. The second substrate 68 has a sixth opening 73a formed in a region corresponding the region where the first opening 58 is made, and also has a sixth opening 73b formed in a region corresponding the region where the third opening 60 is made. The second substrate 68 also has a seventh opening 74 formed in a region corresponding to the region where the second opening 59 is made. The first substrate 67 and the second substrate 68 are fixed to each other to form the holder base 61. More specifically, these two substrates are fixed being in contact with each other so that the fourth opening 70a and the sixth opening 73a coaxially communicate each other, and the same goes for the fourth opening 70b and the sixth opening 73b, and the fifth opening 72 and the seventh opening 74.

The holder base 61 including the first substrate 67 and the second substrate 68 also has a function of supplying ground potential in the same manner as that of the first and the second embodiments. Therefore, it is preferable that electrical contact resistance between the first substrate 67 and the second substrate 68 be as low as possible. As a result, referring to a contact surface where the first substrate 67 and the second substrate 68 mutually contact each other, it is preferable that the contact surface be machined smoothly and surface treatment such as Nickel plating and gold plating be performed on the contact surface.

The first insulating pipe member 63 and the second insulating pipe member 64 are pipe members formed of an insulating material such as Teflon (Registered Trademark), and used to ensure electrical insulation of the signal conductive-contact 55 and the power-supply conductive-contact 57 from the holder base 61. More specifically, the first insulating pipe member 63 is inserted into the fourth openings 70a and 70b, and the second insulating pipe member 64 is inserted into the sixth openings 73a and 73b, respectively. By accommodating the signal conductive-contact 55 and the power-supply conductive-contact 57 in respective hollow portions, electrical insulation of the signal conductive-contact 55 and the power-supply conductive-contact 57 from the holder base 61 is ensured.

If the first insulating pipe member 63 and the second insulating pipe member 64 are formed of Teflon (Registered Trademark), various advantages can be obtained. In other words, Teflon (Registered Trademark) is easy to be machined, and has a low specific dielectric constant $\in_r$ of 2.1. Therefore, in the structure to realize the same intrinsic impedance, as compared with the case where some other materials are used, the value of the outer diameter $d_1$ of the signal conductive-contact 55 can be made larger as shown in Equation (1). In other words, when a high-frequency electrical signal is transmitted, it is generally required to make the intrinsic impedance close to 50 ohms. However, even under such requirement, by forming the first insulating pipe member 63 with the material such as Teflon (Registered Trademark), the outer diameter of the signal conductive-contact 55 can be made larger. By making the outer diameter thereof larger, electrical resistance of the signal conductive-contact 55 can be reduced. Consequently, by forming the first insulating pipe member 63 and the like with the material such as Teflon (Registered Trademark), it is possible to have an advantage that attenuation of a transmission signal can be suppressed.

The inside of the first insulating pipe member 63 and the like formed of Teflon (Registered Trademark) can be structured with a smooth plane, and therefore, sliding resistance upon expansion and contraction of the signal conductive-contact 55 and the power-supply conductive-contact 57 can be further reduced. The power-supply conductive-contact 57 is not restricted by Equation (1), which allows the internal diameter thereof to be made larger in a range in which insulation between the power-supply conductive-contact 57 and the holder base 61 can be ensured. Furthermore, the outer diameter is made larger, which allows a large amount of drive power to be supplied.

The first insulating pipe member 63 has an anti-slip flange 75 that is formed in one end thereof and that has an outer diameter larger than other parts. The first insulating pipe member 63 is inserted into the first substrate 67 so that the anti-slip flange 75 is positioned in the side of a boundary between the first substrate 67 and the second substrate 68. Likewise, the second insulating pipe member 64 has an anti-slip flange 76 in one end thereof, and the second insulating pipe member 64 is inserted into the second substrate 68 so that the anti-slip flange 76 is positioned in the side of the boundary between the first substrate 67 and the second substrate 68.

Each of the first insulating pipe member 63 and the second insulating pipe member 64 has such a shape that the internal diameter thereof is narrowed in an opposite end to each end where the anti-slip flanges 75 and 76 are formed. As explained in the first and the second embodiments, this shape is provided to prevent slipping off of the signal conductive-contact 55 and the power-supply conductive-contact 57 fitted in.

The first conductive pipe member 65 and the second conductive pipe member 66 are used to keep an adequate electrical contact between the ground conductive-contact 56 and the holder base 61. More specifically, the first conductive pipe member 65 and the second conductive pipe member 66 are formed of the conductive material, and are inserted into the holder base 61 so that the outer surfaces thereof are in contact with the holder base 61 and the internal surfaces thereof are in contact with at least a part of the ground conductive-contact 56.

The first conductive pipe member 65 and the second conductive pipe member 66 have anti-slip flanges 77 and 78 formed in one ends thereof, respectively, in the same manner as that of the first insulating pipe member 63. The anti-slip flanges 77 and 78 have an outer diameter larger than other parts. The first conductive pipe member 65 is inserted into the first substrate 67 so that the anti-slip flange 77 is positioned in the side of the boundary between the first substrate 67 and the second substrate 68. The second conductive pipe member 66 is inserted into the second substrate 68 so that the anti-slip flange 78 is positioned in the side of the boundary between the first substrate 67 and the second substrate 68. Furthermore, each of the first conductive pipe member 65 and the second conductive pipe member 66 has a shape such that the internal diameter thereof is narrowed in an opposite end to each end where the anti-slip flanges 77 and 78 are formed to prevent slipping off of the ground conductive-contact 56.

In the third embodiment, the first insulating pipe member 63 has a mutually different shape from the first conductive pipe member 65, and the second insulating pipe member 64 has a mutually different shape from the second conductive pipe member 66. In other words, the first insulating pipe member 63 and the first conductive pipe member 65 are formed so that the outer diameter $d_3$ of the anti-slip flange 75 and the outer diameter $d_4$ of the anti-slip flange 77 are set to $d_4>d_3$ as shown in FIG. 9, and the outer diameter $d_5$ of the pipe portion and the outer diameter $d_6$ thereof are set to $d_6>d_5$. By employing the structure, it is possible to insert the first conductive pipe member 65 into the fifth opening 72 and to insert the second conductive pipe member 66 into the seventh opening 74, while it is difficult to insert the first conductive pipe member 65 into the fourth opening 70a and to insert the second conductive pipe member 66 into the sixth opening 73a.

The signal conductive-contact 55, the ground conductive-contact 56, and the power-supply conductive-contact 57 are briefly explained below. These conductive contacts may have the same structure as these of the first embodiment and the second embodiment, but in the third embodiment, the ground conductive-contact 56 in particular has a structure with improved ground characteristic.

More specifically, as shown in FIG. 9, a needle member 79a has a flange portion 80 of which outer diameter is defined so that the flange portion 80 is in contact with the first conductive pipe member 65, and a needle member 79b has a flange portion 81 of which outer diameter is defined so that the flange portion 81 is in contact with the second conductive pipe member 66. In other words, in the third embodiment, the flange portions 80 and 81 are newly provided for electrical contact between the first conductive pipe member 65 and the second conductive pipe member 66, and the potential of the holder base 61, as ground potential, is supplied to the semiconductor integrated circuit 1 through the flange portions 80 and 81.

From the viewpoint of reducing electrical contact resistance between the ground conductive-contact 56 and the first conductive pipe member 65/the second conductive pipe member 66, it is preferable that both of contact areas be made larger. Therefore, in the third embodiment, each outer diameter of the flange portions 80 and 81 is made as large as possible, and each length of the flange portions 80 and 81 in the contraction direction (the vertical direction of FIG. 9) is made longer to such an extent that bad influence is not exerted over the expansion and contraction operation of the ground conductive-contact 56. By giving such an idea, it is possible that the ground conductive-contact 56 according to the third embodiment supplies ground potential from the holder base 61 to the semiconductor integrated circuit 1 at high efficiency, which allows ground potential of the semiconductor integrated circuit 1 to be stabilized. Furthermore, it is also useful that the ground conductive-contact 56 may be fitted-in in a state where a material for reducing electrical contact resistance such as a contact recovery agent is applied on the outer surface of the ground conductive-contact 56, for example, around the outer periphery of the flange portions 80 and 81. By using the structures, even if the signal supplied to the semiconductor integrated circuit 1 is made higher frequency, it is possible to realize the conductive-contact unit without the increase in transmission loss of the signal.

Some advantages of the conductive-contact unit according to the third embodiment are explained below. In the third embodiment, the conductive-contact unit includes the first insulating pipe member 63 and the first conductive pipe member 65 that are inserted into the first substrate 67, and the second insulating pipe member 64 and the second conductive pipe member 66 that are inserted into the second substrate 68. By providing these pipe members and employing the structure of inserting each conductive contact into the hollow portion of the pipe member, excellent electrical insulation of the signal conductive-contact 55 and the power-supply conductive-contact 57 from the holder base 61 (including the first substrate 67 and the second substrate 68) is realized. Furthermore, excellent electrical contact is realized between the ground conductive-contact 56 and the holder base 61.

The inside of these pipe members is possible to be formed of a smooth plane, and therefore, there is an advantage that the sliding resistance according to the expansion and contraction operation of the conductive contact can be reduced. In other words, as compared with the structure in which the signal conductive-contact 55 is inserted into the first opening 58 (including the fourth opening 70a and the sixth opening 73a) through an insulating film, it is possible to reduce physical contact resistance, by using the pipe member, between the signal conductive-contact 55 and the first opening 58, and to reduce sliding resistance according to the expansion and contraction operation.

The third embodiment has another advantage that mass-productivity of the conductive-contact unit is improved because the pipe members such as the first insulating pipe member 63 are inserted into the first substrate 67 and the second substrate 68, respectively. In other words, in the structure of FIG. 9, assembly of the conductive-contact unit is carried out as follows.

Corresponding pipe members are inserted into the openings such as the fourth opening 70a formed in the first substrate 67 and the second substrate 68, respectively. The conductive contact such as the signal conductive-contact 55 is fitted in the hollow portion of the pipe member in a state where the first substrate 67 with the pipe member inserted is arranged so that the side of the semiconductor integrated circuit 1 of the pipe member is placed in the lower side in the vertical direction (in other words, the contact surface with the second substrate 68 is placed in the upper side in the vertical direction). Furthermore, the second substrate 68 is laid on top of the first substrate 67 with the conductive contact fitted-in in a state of covering the first substrate 67 from the upper side in the vertical direction so that the conductive contact is inserted into the hollow portion of the pipe member. The first substrate 67 and the second substrate 68 are mutually fixed to each other. Thereafter, the necessary members such as the circuit board 2 and the holder member 5 are assembled to finish the conductive-contact unit.

As explained above, the conductive-contact unit according to the third embodiment has a structure with improved mass-production assembly techniques. Moreover, the pipe member is prevented from slipping off by the anti-slip flange. Therefore, by releasing the state where the first substrate 67 and the second substrate 68 are fixed to each other, the pipe members are easily removed from the opening. Furthermore, by releasing the state where the first substrate 67 and the second substrate 68 are fixed to each other, the conductive contact is easily removed from the opening. Thus, the conductive-contact unit has such an advantage that maintenance can be easily performed.

The conductive-contact unit according to the third embodiment has such an advantage that it is possible to prevent occurrence of such an error that the first conductive pipe member 65 and the second conductive pipe member 66 may be inserted into wrong positions. In other words, in the third embodiment, the anti-slip flanges 75 and 76 formed in the first insulating pipe member 63 and the second insulating pipe member 64 are formed so that the outer diameter $d_3$ of the anti-slip flanges 75 and 76 is smaller than the outer diameter $d_4$ of the anti-slip flanges 77 and 78 formed in the first conductive pipe member 65 and the second conductive pipe member 66. The first insulating pipe member 63 is formed so that the outer diameter $d_5$ of this pipe member is smaller than the outer diameter $d_6$ of the pipe member of the first conductive pipe member 65.

By employing such a structure, it is possible to prevent the first conductive pipe member 65 and the second conductive pipe member 66 from being erroneously inserted into the fourth opening 70a and the sixth opening 73a, respectively, into which the first insulating pipe member 63 and the second insulating pipe member 64 should originally be inserted. In other words, if the first conductive pipe member 65 is about to be inserted into the fourth opening 70a by some error, it is physically difficult for the first conductive pipe member 65 to be inserted into the fourth opening 70a because of the difference in the structure of the first insulating pipe member 63 from that of the first conductive pipe member 65. As a result, the first conductive pipe member 65 is prevented beforehand from being inserted into a wrong opening.

Prevention of the first conductive pipe member 65 and the second conductive pipe member 66 from being inserted into wrong portions is very important from the viewpoint as explained below. Because of the prevention, the circuit board 2 and the semiconductor integrated circuit 1 as the target to be tested are prevented from being damaged. Specifically, the circuit board 2 and the semiconductor integrated circuit 1 that are electrically connected to the signal conductive-contact 55 or the power-supply conductive-contact 57, particularly, to the power-supply conductive-contact 57 are prevented from being damaged. In other words, if the first conductive pipe member 65 is inserted into the opening where the signal conductive-contact 55 or the power-supply conductive-contact 57 is to be accommodated, the power-supply conductive-contact 57 or the like is electrically connected to the holder base 61 through the first conductive pipe member 65. Because the potential of the holder base 61 is maintained at ground potential, the power-supply conductive-contact 57 or the like is electrically connected to the holder base 61, and the output terminal for power supply of the semiconductor integrated circuit 1 or the circuit board 2 is thereby directly grounded. Accordingly, a large amount of current passes through the conductive contact, which causes a circuit carried in the circuit board 2 to be destroyed to the level at which the circuit is unusable. Therefore, the third embodiment provides the first conductive pipe member 65 and the second conductive pipe member 66 having such a shape that they are physically impossible to be inserted into wrong openings. This allows occurrence of such an error to be prevented.

Figure 10:
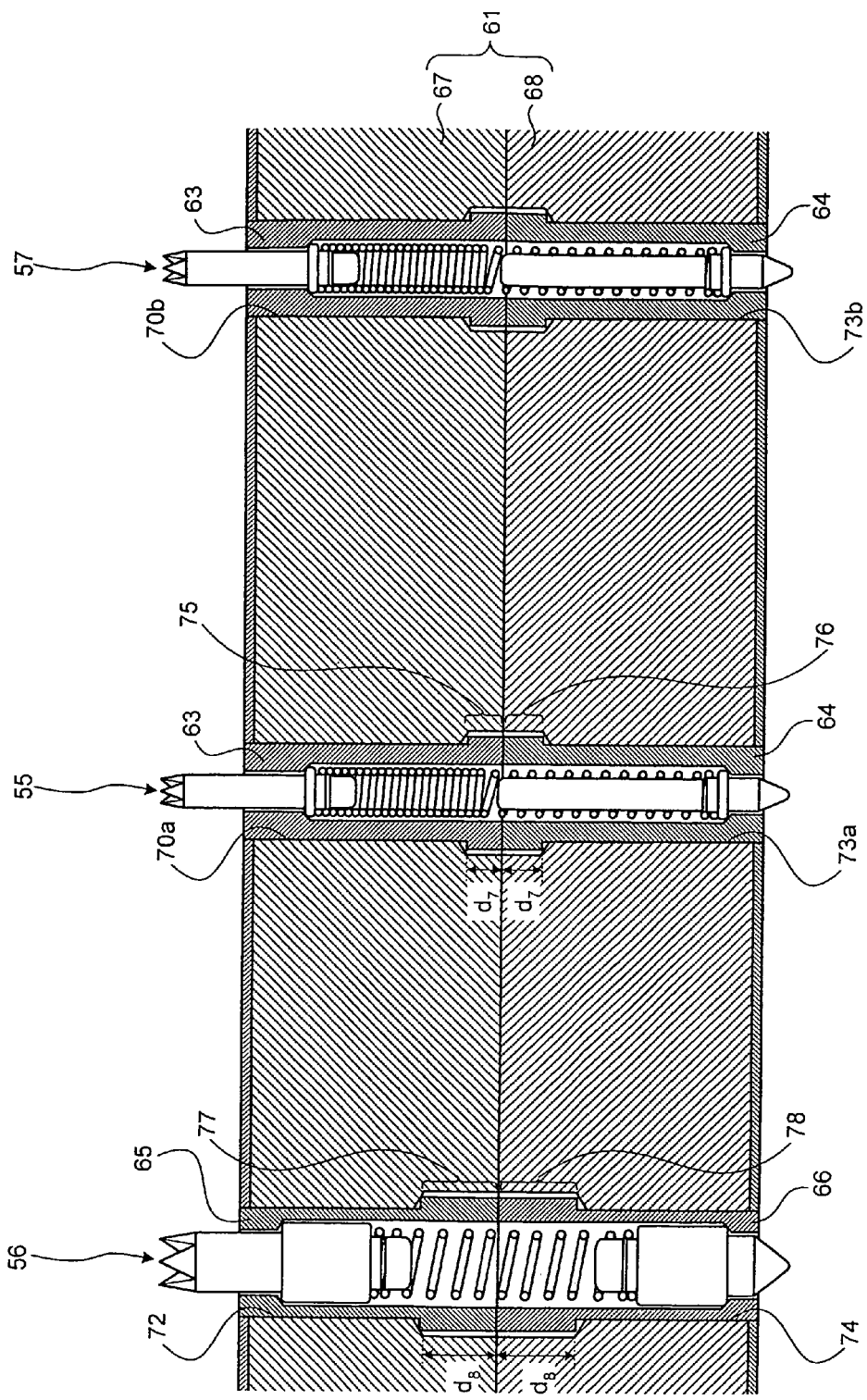
FIG. 10 is a schematic diagram of a modification of the conductive-contact unit according to the third embodiment.

From the viewpoint of suppressing occurrence of the error such that the first conductive pipe member 65 or the like is inserted into a wrong position, a structure as shown in FIG. 10 is also useful. FIG. 10 is an example of a modification of the conductive-contact unit according to the third embodiment. In the modified conductive-contact unit, the anti-slip flanges 75 and 76 and the anti-slip flanges 77 and 78 are formed so that $d_8>d_7$. Where $d_7$ is each length of the anti-slip flanges 75 and 76, in the insertion direction of the pipe members (the length in the vertical direction of FIG. 10), formed in the first insulating pipe member 63 and the second insulating pipe member 64, respectively, and $d_8$ is each length of the anti-slip flanges 77 and 78, in the insertion direction of the pipe members, formed in the first conductive pipe member 65 and the second conductive pipe member 66, respectively.

Some advantages of the modified conductive-contact unit of FIG. 10 are explained below using an example that the first conductive pipe member 65 is inserted into the fourth opening 70a that is a wrong opening. If the outer diameters of the first insulating pipe member 63 and the anti-slip flange 75 are the same as these of the first conductive pipe member 65 and the anti-slip flange 77, and if the outer diameters of the pipe portions are the same as each other, the first conductive pipe member 65 can possibly be inserted also into the wrong opening. However, because the length of the anti-slip flange 75 and the length of the anti-slip flange 77 in the insertion direction thereof have a relation of $d_8>d_7$, even if the first conductive pipe member 65 is inserted into the fourth opening 70a, at least a part of the anti-slip flange 75 is projected from the contact surface of the first substrate 67 with respect to the second substrate 68. Therefore, in this case, when the pipe member is inserted and the first substrate 67 and the second substrate 68 are to be fixed to each other, the projection remains at a portion of the contact surface, which makes it difficult to fix the first substrate 67 and the second substrate 68 in a state where the contact surfaces thereof are in contact with each other. Consequently, the structure of FIG. 10 makes it possible to prevent manufacturing of the conductive-contact unit with the first conductive pipe member 65 erroneously inserted into the fourth opening 70a, and to avoid serious damage to the semiconductor integrated circuit 1 and the circuit board 2.

From the viewpoint of preventing occurrence of the error such that the pipe member is inserted into a wrong position, the structure of the pipe member is not necessarily limited to the structure as shown in FIG. 9 or FIG. 10. The first insulating pipe member 63 and the first conductive pipe member 65 simply have different outer shapes from each other. Therefore, in the structure of FIG. 9, only one of $d_4>d_3$ and $d_6>d_5$ may be satisfied. Alternatively, the difference between the two is provided not by their outer diameters, but may be provided by different shapes of cross section.

Furthermore, the third embodiment employs the structure in which the first conductive pipe member 65 and the second conductive pipe member 66 are interposed between the ground conductive-contact 56 and the holder base 61. Therefore, an electrical resistance between the ground conductive-contact 56 and the holder base 61 can be reduced, and the inside of the pipe member can be formed with a smooth plane, which makes it possible to reduce sliding resistance during expansion and contraction operation of the ground conductive-contact 56.

The third embodiment realizes an electrical contact of the ground conductive-contact 56 with the holder base 61 through the flange portions 80 and 81. Therefore, a spring member 82 is not caused to have a function of maintaining the electrical contact with the first conductive pipe member 65 or the like. As a result, the spring member 82 does not need to include a densely wound portion provided from the viewpoint of increasing the contact area, and can be formed only with a sparsely wound portion. By employing such a structure, elastic force supplied from the spring member 82 to the needle members 79a and 79b is increased, and a range of expansion and contraction of the spring member 82 can be enlarged.

The outer diameters of the flange portions 80 and 81 are defined to physically contact the first conductive pipe member 65 and the second conductive pipe member 66, and therefore, the third embodiment has another advantage that a positioning precision of the conductive contact for grounding is improved. In other words, in the third embodiment, the ground conductive-contact 56 inserted into the second opening 59 is in a state where the outer surfaces of the flange portions 80 and 81 are kept in contact with the internal surfaces of the first conductive pipe member 65 and the like. As a result, in the third embodiment, the position of the ground conductive-contact 56 is uniquely determined, which makes it possible to prevent occurrence of positional displacement.

FIG. 11 to FIG. 13 are schematic diagrams of structures of other modifications of the conductive-contact units. More specifically, there is used a so-called barrel type conductive contact at least a part of which includes a spring member.

As shown in FIG. 11, a signal conductive-contact 83 includes needle members 86 and 87 having the same shape as that of the first embodiment, and a pipe body 88 that is formed to cover parts of the base edge sides of the needle members 86 and 87 and the spring member (not shown). The outer surface of the pipe body 88 is cylindrically formed. Likewise, a ground conductive-contact 84 includes needle members 89 and 90 and a pipe body 91, and a power-supply conductive-contact 85 includes needle members 92 and 93 and a pipe body 94. The barrel type conductive contact is explained below with reference to the ground conductive-contact 84 as a typical example of the conductive contacts.

The pipe body 91 is formed to include at least parts of the base edge sides of the needle members 89 and 90 and the spring member. The needle members 89 and 90 have a hollow inside thereof, and the spring member is arranged between the needle members 89 and 90 and is used for elastically biasing the two. The pipe body 91 has an internal diameter almost the same as the outer diameter of the needle members 89 and 90 to maintain the state of being electrically connected to the needle members 89 and 90. More specifically, the pipe body 91 always maintains the electrical contact with the needle members 89 and 90 even when the needle members 89 and 90 are sliding.

Using the barrel type conductive contact including the pipe body is useful particularly for the ground conductive-contact 84. In other words, as shown in FIG. 11, because the pipe body 91 has a cylindrical shape with a long length in its insertion direction, the barrel type conductive contact has a large contact area between the pipe body 91 and a fifth opening 100 or a seventh opening 101, and thereby has electrical contact resistance reduced. The fifth opening 100 is formed in a first substrate 98, and the seventh opening 101 is formed in a second substrate 99. Consequently, the modified conductive-contact unit as shown in FIG. 11 can have a structure such that the ground conductive-contact 84 makes a direct physically contact with the first substrate 98 and the second substrate 99 without interposing the conductive pipe member.

There is another advantage by which the signal conductive-contact 83 and the power-supply conductive-contact 85 are formed with the barrel type conductive contact. In other words, the positions and the shapes of the pipe body 88 and the pipe body 94 do not change when the needle members 86 and 87 are sliding. Therefore, there is no need to provide smoothness to the internal surfaces of a first insulating pipe member 95 and a second insulating pipe member 96. Thus, the modified conductive-contact unit is further advantageous in that the flexibility of selecting the shape of and the material for the first insulating pipe member 95 better.

It is noted that all the conductive contacts are not necessarily formed to the barrel type, unlike the case of FIG. 11. By employing the barrel type for at least a part of the conductive contacts, the advantages are obtained. More specifically, as shown in FIG. 12, the conductive-contact unit may include the ground conductive-contact 84 of the barrel type, and the signal conductive-contact 55 and the power-supply conductive-contact 57 both of which have the same structure as that of the third embodiment. As shown in FIG. 13, the conductive-contact unit may include the signal conductive-contact 83 of the barrel type and the power-supply conductive-contact 85 of the barrel type, and the ground conductive-contact 56 which has the same structure as that of the third embodiment.

Although the present invention has been explained with reference to the first to the third embodiments and the modifications thereof, the present invention is not limited thereto. Various modifications and embodiments can be thought of by persons skilled in the art. For example, it is possible to form a conductive-contact holder and a conductive-contact unit by assembling the first embodiment and the second embodiment. In other words, the structure of the second embodiment may be used for the signal conductive-contact 15 while the structure of the first embodiment may be used for the ground conductive-contact 16. In addition, it is possible to realize a conductive-contact holder and a conductive-contact unit with a structure obtained by assembling the structures as explained in the first embodiment to the third embodiment and the modifications thereof as required.

As is apparent from the shape of the holder member 5 in the first embodiment and the like, it is assumed that the present invention is used in the integrated circuit such as a semiconductor chip. However, it is not necessarily limited to this form. For example, the present invention may be used in a device that detects characteristics of a liquid crystal panel. Furthermore, the structure of the conductive contact is not also limited to that of the first embodiment and the like, and in the present invention, any structure is possible to be used.

For the conductive-contact unit according to the first embodiment and the like, the transmission method of inputting and outputting signals in particular is not clearly mentioned, but both of single end transmission and differential transmission can be used. More specifically, the conductive-contact unit according to the first embodiment and the like has such an advantage that transmission characteristic of high-frequency electrical signals can be improved irrespective of the transmission methods.

In the third embodiment, it is also useful that the first insulating pipe member 63 and the first conductive pipe member 65 are formed with the same outer shape as that of the first and the second embodiments. In this case, the respective pipe members can easily be replaced with each other, and therefore, it is advantageous that pin assign can easily be changed. More specifically, referring to the conductive-contact unit of which pin assign is decided and which is mass-produced, it is preferable that the outer shapes of the pipe members be different from each other. However, in the previous stage, for example, when the pin assign is to be decided, it is preferable that the first insulating pipe member 63 and the like and the first conductive pipe member 65 and the like be formed using the same outer shape. Furthermore, even if testing is conducted on a plurality of types of the semiconductor integrated circuits 1 having different circuit configurations, the pin assign can be easily changed, which is preferable.

Furthermore, in the above embodiments, the needle member forming the conductive contact for grounding and the second opening are formed so that the outer diameter of the flange portion of the needle member thereof and the internal diameter of the second opening (or the conductive pipe member when the conductive pipe member is inserted into the second opening) are almost the same as each other. However, the present invention is not limited to the structure. For example, by setting the outer diameter of the flange portion to a smaller value than the internal diameter of the second opening and the like, the sliding resistance between the conductive contact for grounding and the second opening and the like is reduced. Alternatively, it is also preferable that the conductive contact for grounding be structured so that the needle member is decentered in the second opening.

FIG. 14 is a schematic diagram for explaining a conductive-contact unit including a conductive contact for grounding with a needle member decentered. Although FIG. 14 depicts the conductive-contact unit corresponding to the structure according to the third embodiment, the conductive-contact unit may be applicable to the first embodiment and the like.

As shown in FIG. 14, needle members 103 and 104 that form a conductive contact for grounding 102 are formed so that the outer diameter of flange portions 105 and 106 of the respective needle members 103 and 104 is slightly smaller than the internal diameter of the first conductive pipe member 65 and the second conductive pipe member 66. A spring member 107 arranged between the needle members 103 and 104 structured in the above manner has a structure without the densely wound portion and the end turn portion.

Omission of the densely wound portion and the end turn portion causes the spring member 107 to reduce the strength of keeping the posture of the needle members 103 and 104. As a result, the central axis of the needle members 103 and 104 is inclined by a fixed angle with respect to the central axis of the second opening 59. With the inclination, respective parts of the flange portions 105 and 106 come in contact with the internal surfaces of the first conductive pipe member 65 and the second conductive pipe member 66, and the needle members 103 and 104 are thereby held in the above state by the inside of the second opening 59. For instance, in the example of FIG. 14, the needle members 103 and 104 are decentered in the vertical direction indicated by arrows, which causes the central axis of the needle member 103 to be inclined by a fixed angle in the clockwise with respect to the central axis of the second opening 59 and causes the central axis of the needle member 104 to be inclined by a fixed angle in the counter-clockwise with respect to the central axis of the second opening 59. The central axes of the needle members 103 and 104 are inclined in the above manner to allow the flange portions 105 and 106 of the needle members 103 and 104 to be electrically connected to the first conductive pipe member 65 and the like in regions indicated by lateral arrows of FIG. 14. More specifically, in the conductive-contact unit as shown in FIG. 14, although the outer diameter of the flange portions 105 and 106 is made slightly smaller than the internal diameter of the first conductive pipe member 65 and the like, the respective parts of the outer surfaces of the flange portions 105 and 106 surely come in contact with the first conductive pipe member 65 and the like. Thus, in the conductive-contact unit, electrical conduction between the two can be ensured, and the conductive contact 102 for grounding can adequately function as the conductive contact for grounding.

INDUSTRIAL APPLICABILITY

As described above, the conductive-contact holder and the conductive-contact unit according to the present invention are suitable for inspecting electric characteristics of a circuit structure of, for example, a semiconductor integrated circuit.

The invention claimed is:

1. A conductive-contact holder that accommodates at least a signal conductive-contact that is a conductive contact for performing input and output of a signal for a predetermined circuit configuration, the conductive-contact holder comprising:
   a holder base that includes an opening for accommodating the signal conductive-contact; and
   an impedance correcting member that is formed of an dielectric material and is formed to be positioned along an outer periphery of the signal conductive-contact while the signal conductive-contact is accommodated in the opening, and that corrects an intrinsic impedance of the signal conductive-contact,
   wherein the impedance correcting member is configured to have an outer diameter that is set so as to substantially match the intrinsic impedance of the signal conductive-contact with that of the predetermined circuit configuration.

2. The conductive-contact holder according to claim 1, wherein
   the signal conductive-contact is in a cylindrical shape with a predetermined outer diameter, and
   the impedance correcting member is in a tubular shape and coaxial with the signal conductive-contact, and corrects the intrinsic impedance by adjusting an outer diameter of the tubular shape and the dielectric constant of the dielectric material.

3. The conductive-contact holder according to claim 1, wherein
   the holder base is electrically conductive.

4. The conductive-contact holder according to claim 1, wherein
   the holder base is formed of a material conforming to a thermal expansion coefficient of the predetermined circuit configuration.

5. The conductive-contact holder according to claim 1, wherein
   the holder base further includes
      a second opening for accommodating a power-supply conductive-contact that supplies power to the predetermined circuit configuration; and
      an insulating member that covers an inner surface of the second opening.

* * * * *